(12) United States Patent
Yamaguchi et al.

(10) Patent No.: US 11,239,407 B2
(45) Date of Patent: Feb. 1, 2022

(54) FREQUENCY ADJUSTMENT METHOD OF VIBRATOR ELEMENT

(71) Applicant: Seiko Epson Corporation, Tokyo (JP)

(72) Inventors: Keiichi Yamaguchi, Ina (JP); Seiichiro Ogura, Minowa (JP); Masahiro Oshio, Shiojiri (JP); Ryuta Nishizawa, Nagano (JP)

(73) Assignee: Seiko Epson Corporation

( * ) Notice: Subject to any disclaimer, the term of this patent is extended or adjusted under 35 U.S.C. 154(b) by 823 days.

(21) Appl. No.: 16/023,057

(22) Filed: Jun. 29, 2018

(65) Prior Publication Data
US 2019/0006575 A1    Jan. 3, 2019

(30) Foreign Application Priority Data

Jun. 30, 2017 (JP) .............................. JP2017-129451

(51) Int. Cl.
| | |
|---|---|
| *H01L 41/09* | (2006.01) |
| *H01L 41/053* | (2006.01) |
| *H01L 41/22* | (2013.01) |
| *H01L 41/047* | (2006.01) |
| *H03H 9/10* | (2006.01) |

(Continued)

(52) U.S. Cl.
CPC ........ *H01L 41/0926* (2013.01); *H01L 41/047* (2013.01); *H01L 41/053* (2013.01); *H01L 41/22* (2013.01); *H03H 3/04* (2013.01); *H03H 9/0528* (2013.01); *H03H 9/0547* (2013.01); *H03H 9/1014* (2013.01); *H03H 9/215* (2013.01);

(Continued)

(58) Field of Classification Search
CPC ... H01L 41/042; H01L 41/047; H01L 41/053; H01L 41/0926; H01L 41/22; H03H 2003/0442; H03H 2003/045
See application file for complete search history.

(56) References Cited

U.S. PATENT DOCUMENTS 8,390,389 B2 *  3/2013 Kawai .................. H03H 9/1021
                                                            331/156
9,546,869 B2 *  1/2017 Yamaguchi ........ G01C 19/5621
(Continued)

FOREIGN PATENT DOCUMENTS

| JP | 2006-311444 A | 11/2006 |
|---|---|---|
| JP | 3843779 B2 | 11/2006 |

(Continued)

*Primary Examiner* — Minh N Trinh
(74) *Attorney, Agent, or Firm* — Harness, Dickey & Pierce, P.L.C.

(57) ABSTRACT

A frequency adjustment method of a vibrator element includes preparing a vibrator element that has a vibrating arm, a first weight placed on one principal surface of the vibrating arm, and a second weight placed on the other principal surface of the vibrating arm, in which the first weight has a non-overlapping region which does not overlap the second weight in a plan view in a normal direction of the principal surface, preparing a substrate including a wiring portion, and fixing the vibrator element to the substrate by causing the other principal surface side of the vibrator element to face the substrate side, and irradiating the non-overlapping region of the first weight with an energy ray from one principal surface side, removing a portion of the non-overlapping region of the first weight, and adjusting a resonance frequency of the vibrating arm.

4 Claims, 24 Drawing Sheets

(51) Int. Cl.
*H03H 9/215* (2006.01)
*H03H 9/05* (2006.01)
*H03H 3/04* (2006.01)
*H01L 41/04* (2006.01)

(52) U.S. Cl.
CPC ...... *H01L 41/042* (2013.01); *H03H 2003/045* (2013.01); *H03H 2003/0442* (2013.01)

(56) References Cited

U.S. PATENT DOCUMENTS

| | | | |
|---|---|---|---|
| 2011/0156827 A1* | 6/2011 | Kawai | H03H 9/1021 |
| | | | 331/116 R |
| 2011/0298555 A1 | 12/2011 | Kawai | |
| 2014/0020503 A1 | 1/2014 | Yamaguchi et al. | |
| 2017/0179366 A1* | 6/2017 | Kobayashi | H01L 41/094 |
| 2019/0006575 A1* | 1/2019 | Yamaguchi | H03H 9/1014 |

FOREIGN PATENT DOCUMENTS

| | | |
|---|---|---|
| JP | 2011-250226 A | 12/2011 |
| JP | 2011-259120 A | 12/2011 |
| JP | 2014-021038 A | 2/2014 |

* cited by examiner

FREQUENCY ADJUSTMENT METHOD OF VIBRATOR ELEMENT

BACKGROUND

1. Technical Field

The present invention relates to a frequency adjustment method of a vibrator element, a vibrator element, a vibrator, an electronic device, and a vehicle.

2. Related Art

For example, JP-A-2006-311444 discloses a piezoelectric device having a tuning fork type vibrator element having a pair of vibrating arms and a package for accommodating the vibrator element. Weights for adjusting a frequency are respectively disposed on both surfaces of the vibrating arm. According to this piezoelectric device, in a state where the vibrator element is fixed to the package, the weight is irradiated with laser light from above, and the weight is partially removed so as to adjust a drive frequency of the vibrator element.

However, according to the vibrator element disclosed in JP-A-2006-311444, the weights are respectively disposed on both surfaces of the vibrating arm. Accordingly, if the weight is irradiated with the laser light, not only the weight on an upper surface (surface on a side opposite to a bottom surface of the package) of the vibrating arm but also the weight on a lower surface (surface on the bottom surface side of the package) is removed. The lower surface of the vibrating arm faces the bottom surface of the package. Accordingly, a splash (dross) evaporated from the weight on the lower surface is likely to adhere to the bottom surface of the package. Wires are pulled around on the bottom surface of the package. Accordingly, if the splash adheres to the bottom surface of the package, a short circuit is caused between the wires, or unexpected parasitic capacitance is generated, thereby causing a possibility that electrical characteristics of the piezoelectric device may become poor. If the splash adhering to the package once is detached due to an impact and adheres again to the vibrator element, there is a possibility that the short circuit may be caused between electrodes or that vibration characteristics may become poor due to a change in mass.

According to the vibrator element disclosed in JP-A-2006-311444, a thickness (mass) differs between a weight placed on the upper surface of the vibrating arm and the weight placed on the lower surface. Consequently, a centroid of the vibrating arm deviates from a center in a thickness direction of the vibrating arm. Therefore, when driven, the vibrating arm performs out-of-plane vibration (in the thickness direction of the vibrating arm), thereby causing a possibility that the vibration leakage may increase.

SUMMARY

An advantage of some aspect of the invention is to provide a frequency adjustment method of a vibrator element, a vibrator element, a vibrator, an electronic device, and a vehicle, in which a splash is less likely to remain while vibration leakage is suppressed.

The invention can be implemented as the following application examples.

A frequency adjustment method of a vibrator element according to an aspect of the invention includes preparing a vibrator element that has a vibrating arm, a first weight placed on one principal surface of the vibrating arm, and a second weight placed on the other principal surface of the vibrating arm, and in which the first weight has a non-overlapping region which does not overlap the second weight in a plan view in a normal direction of the principal surface, preparing a substrate including a wiring, and fixing the vibrator element to the substrate by causing a side of the other principal surface of the vibrator element to face a side of the substrate, and irradiating the non-overlapping region of the first weight with an energy ray from one principal surface side, removing a portion of the non-overlapping region of the first weight, and adjusting a resonance frequency of the vibrating arm.

According to this configuration, it is possible to provide the frequency adjustment method of the vibrator element in which a splash is unlikely to remain while vibration leakage is suppressed.

In the frequency adjustment method of a vibrator element according to the aspect of the invention, it is preferable that in the vibrator element prepared in the preparing of the vibrator element, the first weight is placed at an area including a center in a width direction of the vibrating arm in a plan view.

According to this configuration, the first weight is likely to be irradiated with the energy ray.

In the frequency adjustment method of a vibrator element according to the aspect of the invention, it is preferable that in the vibrator element prepared in the preparing of the vibrator element, the second weight is placed at an area including both side portions across a center in a width direction of the vibrating arm in a plan view.

According to this configuration, the non-overlapping region is likely to be formed in the first weight.

In the frequency adjustment method of a vibrator element according to the aspect of the invention, it is preferable that in the preparing of the vibrator element, mass of the first weight is greater than mass of the second weight.

According to this configuration, mass balance is likely to be maintained between the first weight and the second weight after being irradiated with the energy ray.

In the frequency adjustment method of a vibrator element according to the aspect of the invention, it is preferable that in the adjusting of the resonance frequency of the vibrating arm, the first weight is partially removed so as to satisfy a relationship of $0 \leq D \leq 0.2T$ when a thickness of the vibrating arm is set to T and a separation distance is set to D in a thickness direction of the vibrating arm between a centroid of a weight including the first weight and the second weight and a centroid of the vibrating arm, in a cross-sectional view of the vibrating arm.

According to this configuration, it is possible to more effectively suppress the vibration leakage.

A vibrator element according to another aspect of the invention includes a base portion, a vibrating arm that extends in a first direction from the base portion, a first weight that is placed on one principal surface of the vibrating arm, and a second weight that is placed on the other principal surface of the vibrating arm. In a plan view in a normal direction of the principal surface, the first weight has a non-overlapping region which does not overlap the second weight, at an area including a center in a width direction of the vibrating arm. In a cross-sectional view of the vibrating arm, when a thickness of the vibrating arm is set to T and a separation distance is set to D in a thickness direction of the vibrating arm between a centroid of a weight including the first weight and the second weight and a centroid of the vibrating arm, a relationship of $0 \leq D \leq 0.2T$ is satisfied.

According to this configuration, the vibrator element can suppress the vibration leakage.

In the vibrator element according to the aspect of the invention, it is preferable that the first weight and the second weight are disposed in a distal end region on a side opposite to the base portion, which is a wide portion whose size in a second direction serving as a direction orthogonal to the first direction of the vibrating arm and parallel to the principal surface is greater than a size of the base portion side. It is preferable that at least one of a length in the second direction of the first weight and a length in the second direction of the second weight is equal to or longer than ½ of a length in the second direction of the wide portion.

According to this configuration, the weight can improve rigidity (particularly, torsional rigidity) of the vibrating arm.

A vibrator according to another aspect of the invention includes the vibrator element according to the aspect of the invention and a package that accommodates the vibrator element.

According to this configuration, it is possible to achieve an advantageous effect of the vibrator element according to the aspect of the invention, thereby providing the highly reliable vibrator.

An electronic device according to another aspect of the invention includes the vibrator element according to the aspect of the invention.

According to this configuration, it is possible to achieve an advantageous effect of the vibrator element according to the aspect of the invention, thereby providing the highly reliable electronic device.

A vehicle according to another aspect of the invention includes the vibrator element according to the aspect of the invention.

According to this configuration, it is possible to achieve an advantageous effect of the vibrator element according to the aspect of the invention, thereby providing the highly reliable vehicle.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a frequency adjustment method of a vibrator element, a vibrator element, a vibrator, an electronic device, and a vehicle according to the invention will be described in detail with reference to embodiments illustrated in the accompanying drawings.

First Embodiment

First, a frequency adjustment method of a vibrator element, a vibrator element, and a vibrator according to a first embodiment of the invention will be described.

Figure 1:
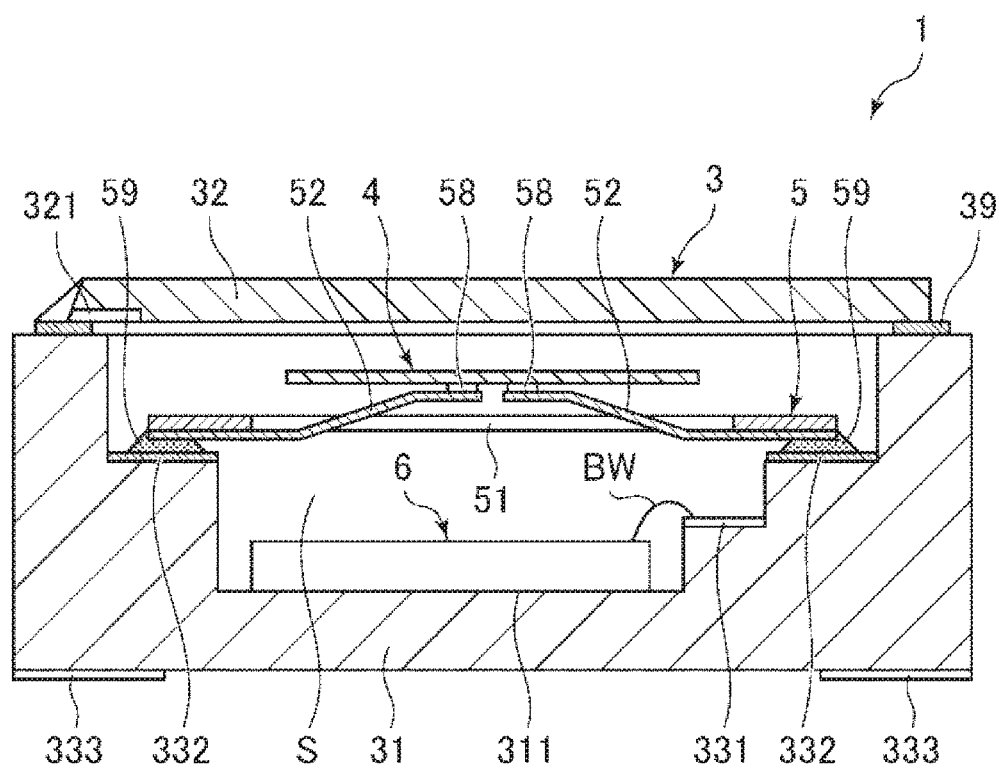
FIG. 1 is a sectional view of a vibrator according to a first embodiment of the invention.
Figure 2:
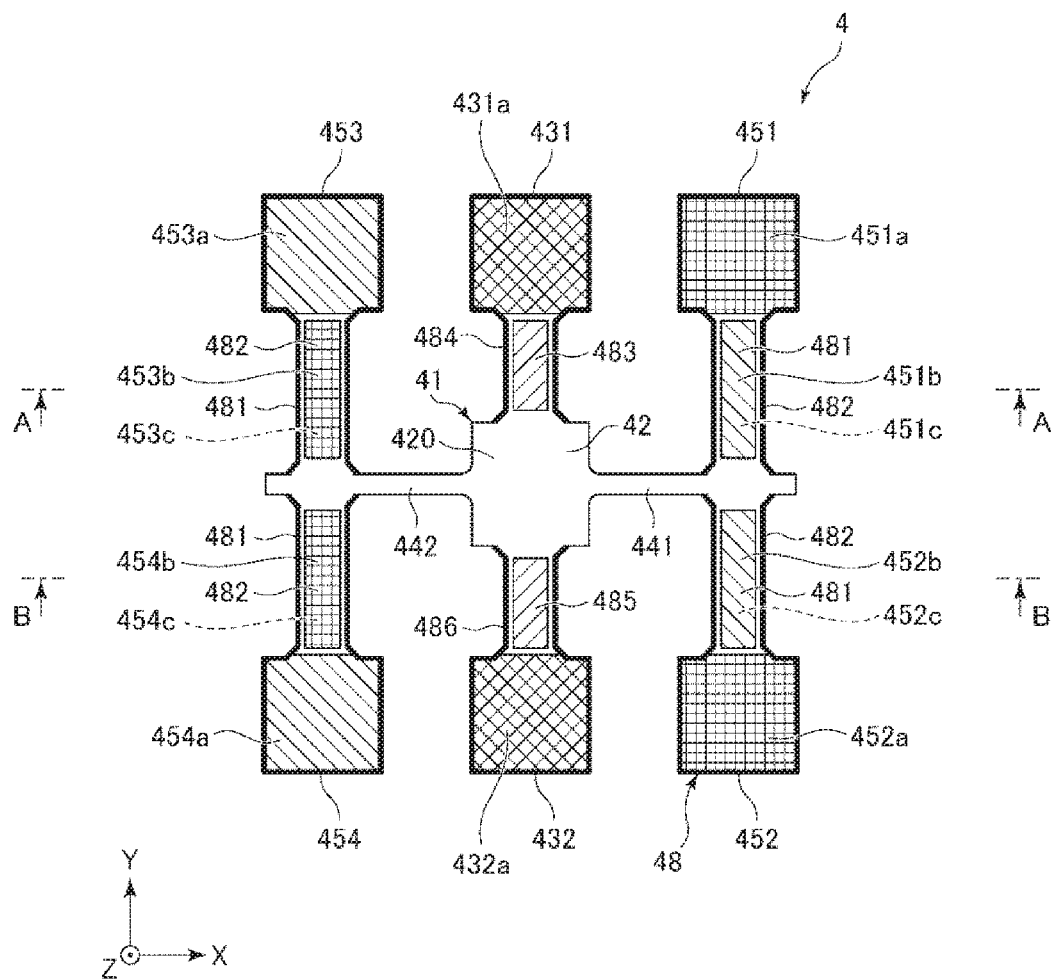
FIG. 2 is a plan view of a vibrator element belonging to the vibrator illustrated in FIG. 1.
Figure 3:
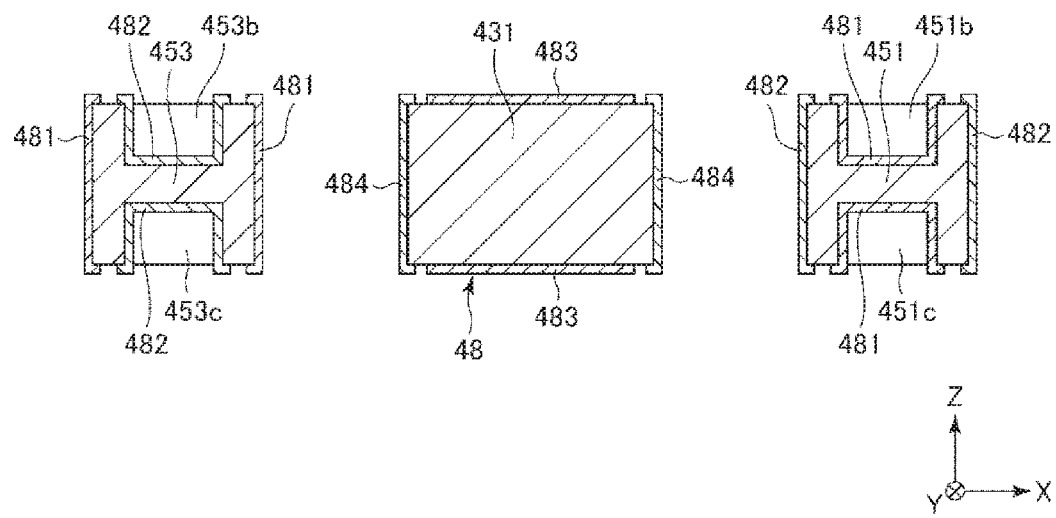
FIG. 3 is a sectional view taken along line A-A in FIG. 2.
Figure 4:
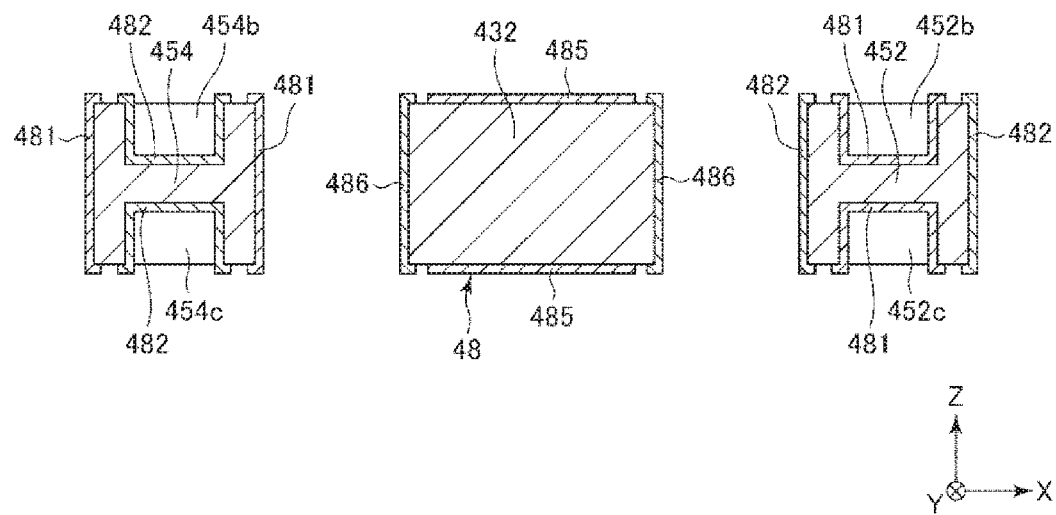
FIG. 4 is a sectional view taken along line B-B in FIG. 2.
Figure 5:
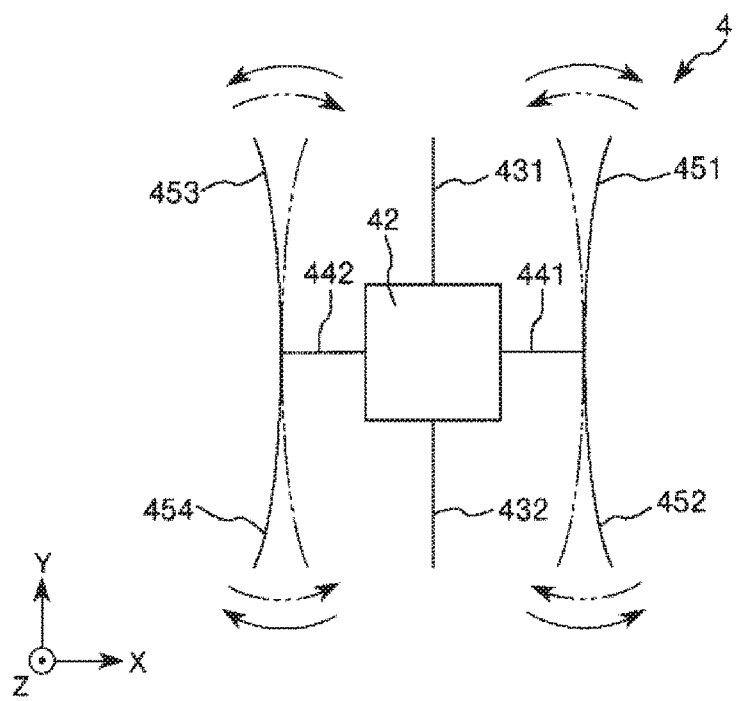
FIG. 5 is a schematic view illustrating a drive vibration mode of the vibrator element illustrated in FIG. 2.
Figure 6:
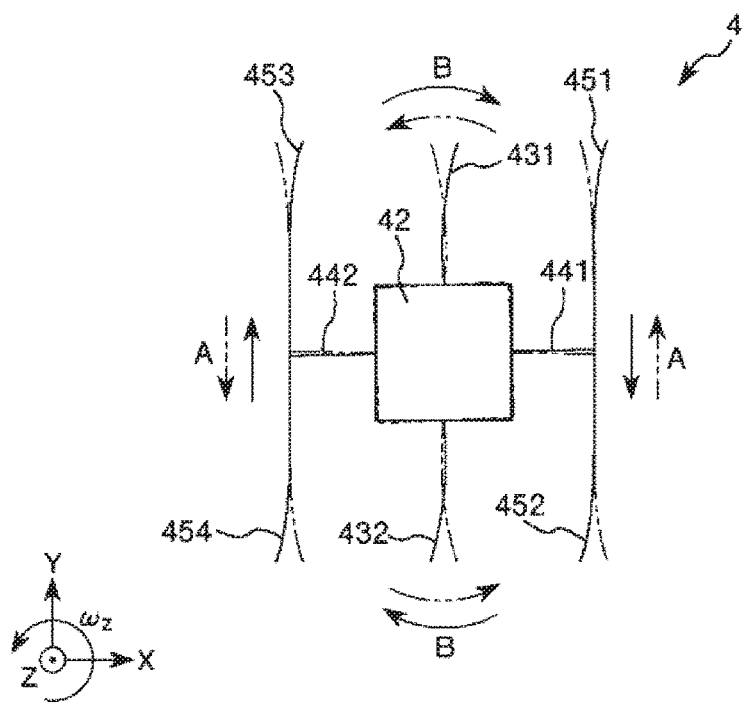
FIG. 6 is a schematic view illustrating a detection vibration mode of the vibrator element illustrated in FIG. 2.
Figure 7:
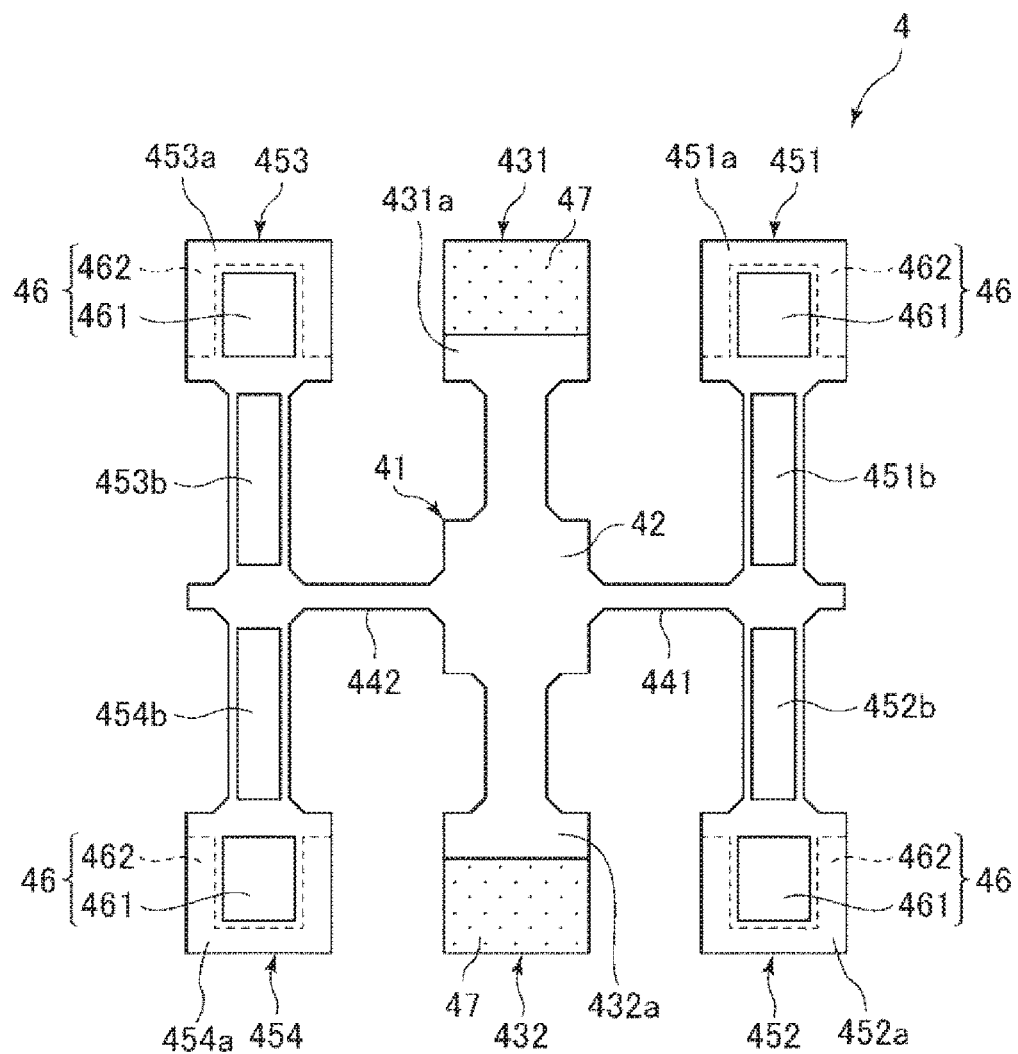
FIG. 7 is a plan view illustrating a weight of the vibrator element illustrated in FIG. 2.
Figure 8:
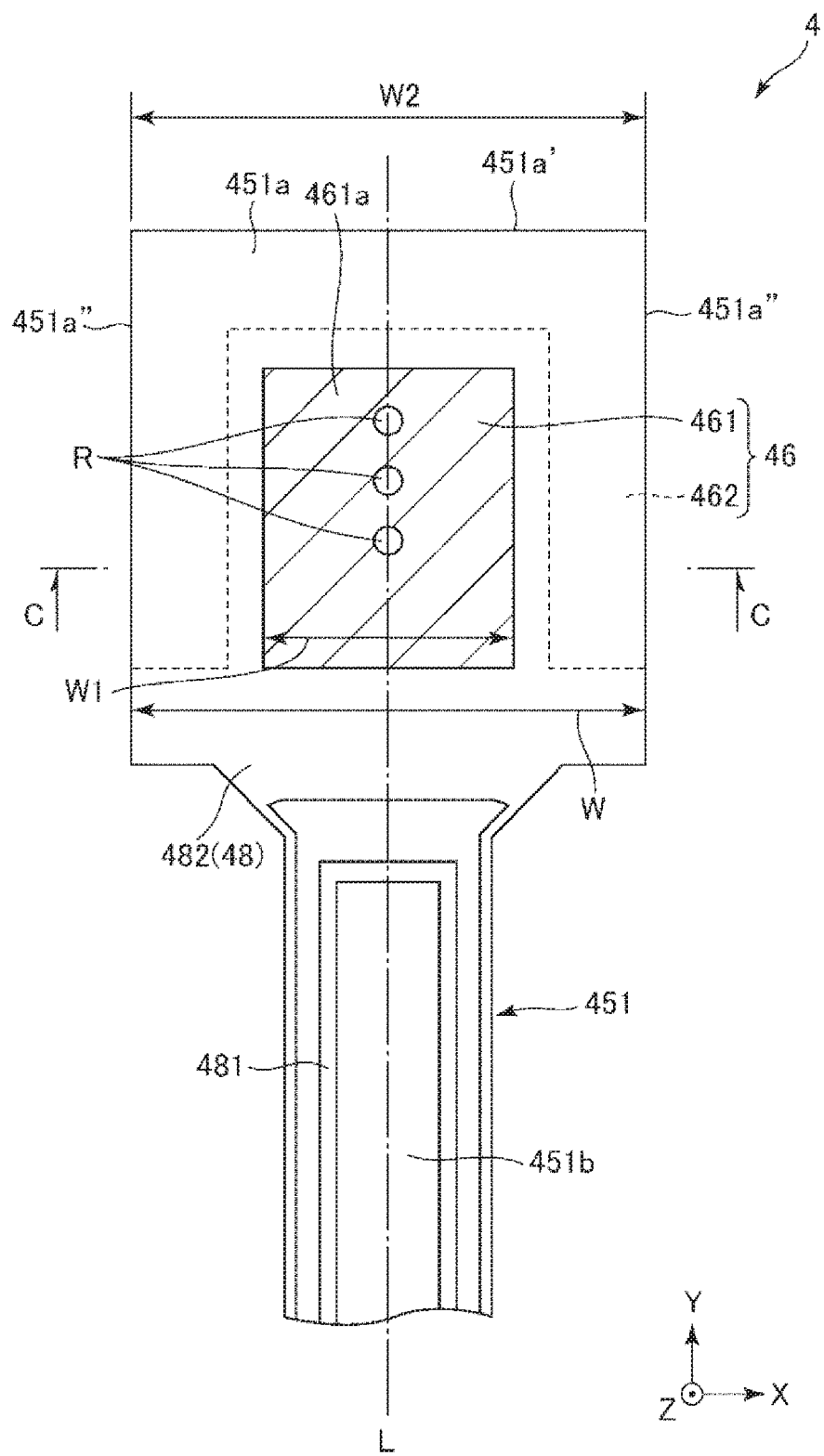
FIG. 8 is a partial enlarged plan view of a drive arm belonging to the vibrator element illustrated in FIG. 2.
Figure 9:
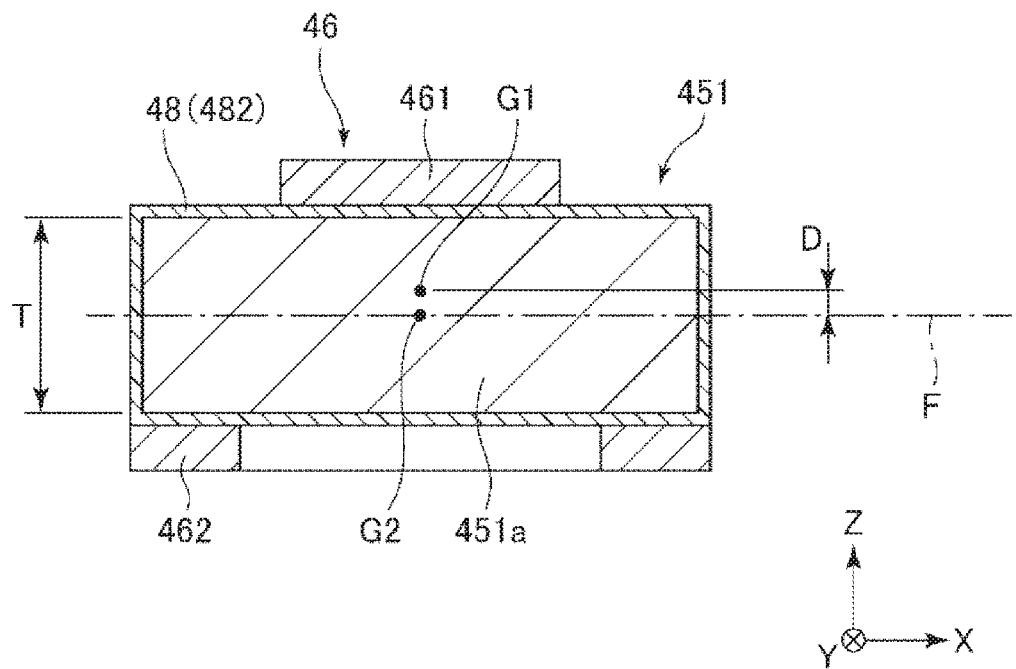
FIG. 9 is a sectional view taken along line C-C in FIG. 8.
Figure 10:
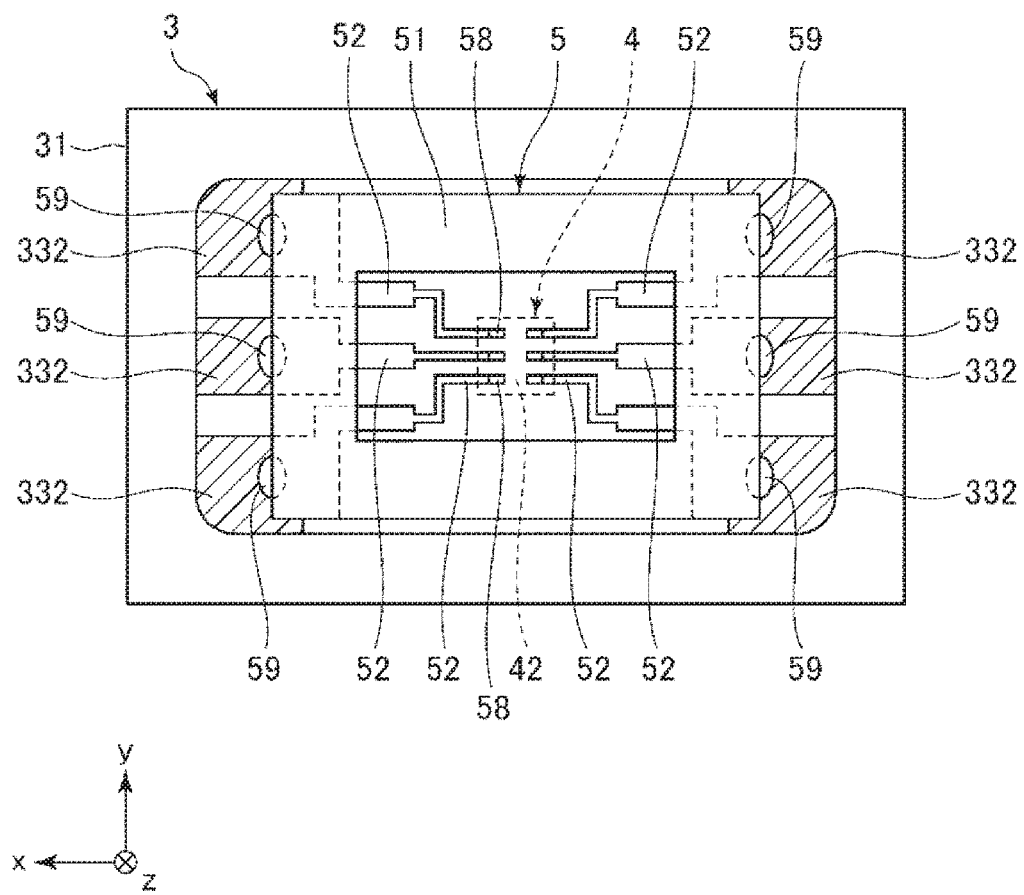
FIG. 10 is a plan view of a support substrate belonging to the vibrator illustrated in FIG. 1.
Figure 11:
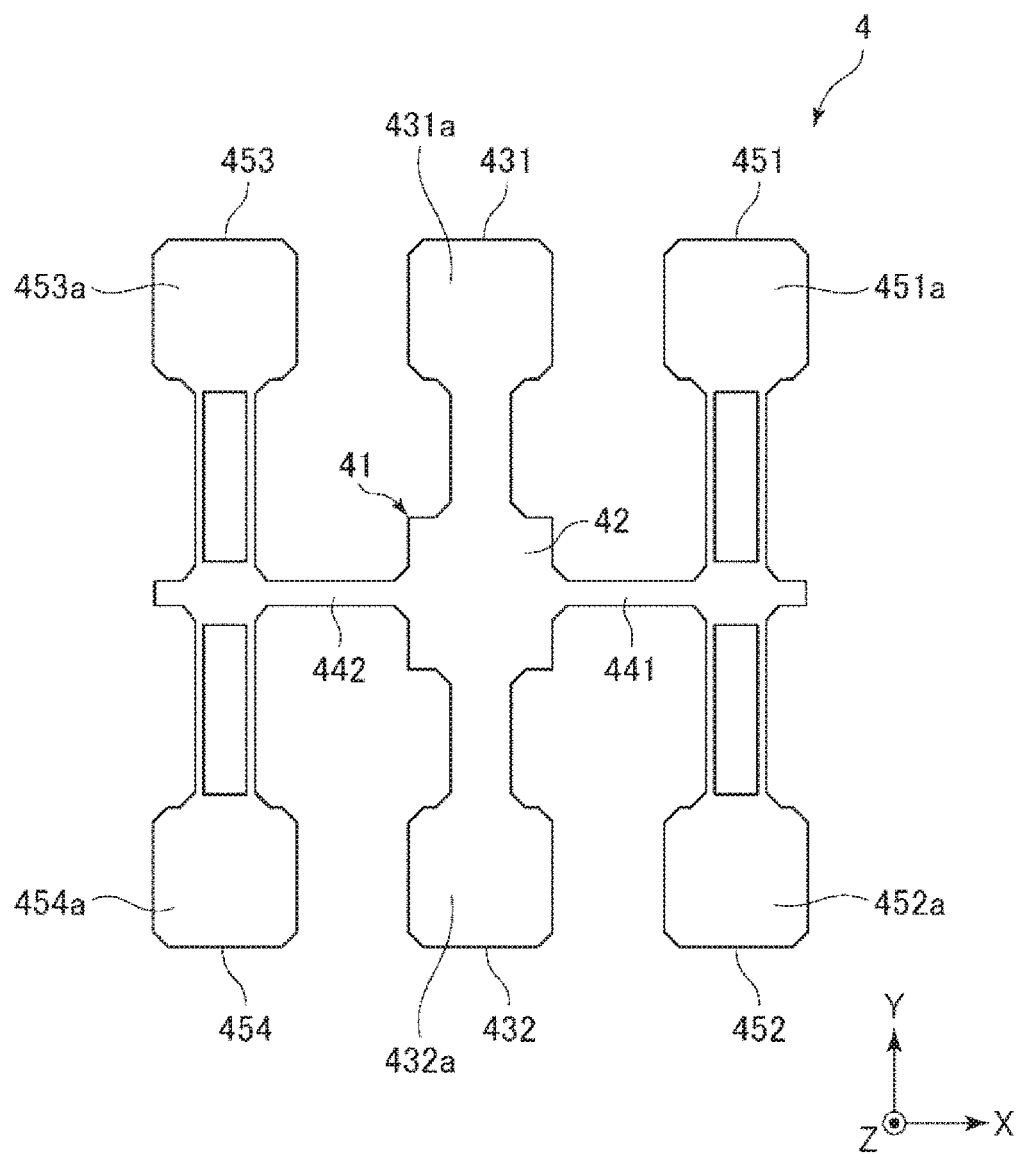
FIG. 11 is a plan view illustrating a modification example of the vibrator element illustrated in FIG. 2.
Figure 12:
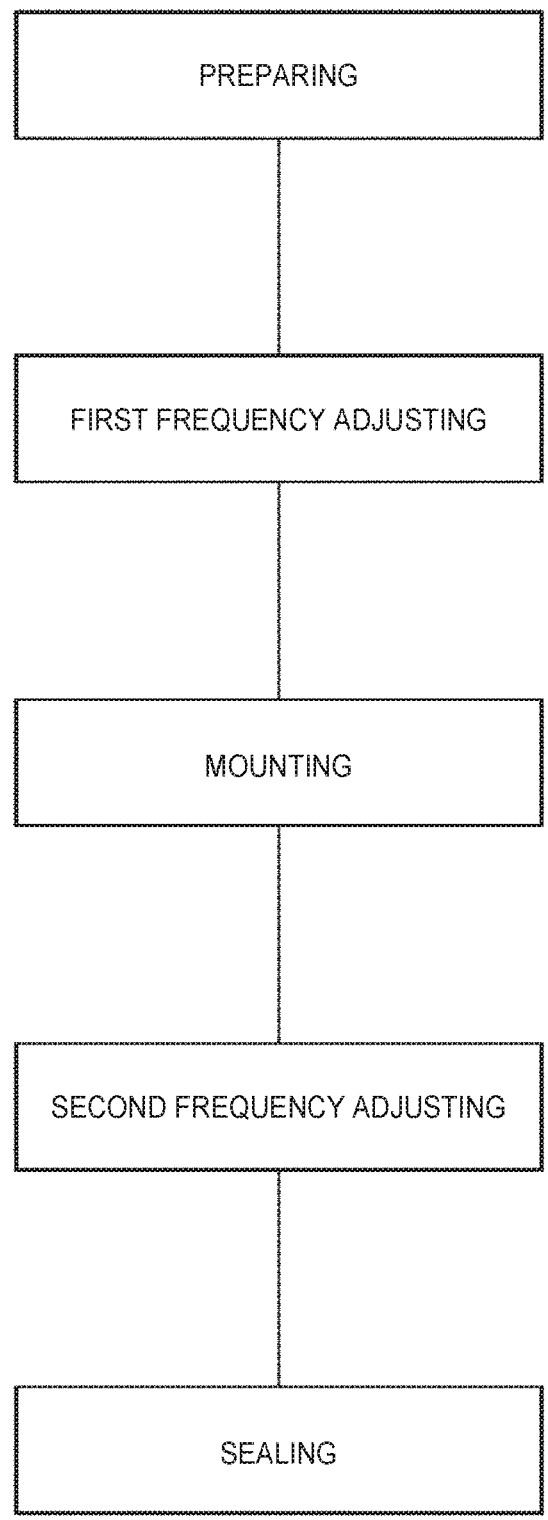
FIG. 12 is a flowchart illustrating a frequency adjustment step of the vibrator element.
Figure 13:
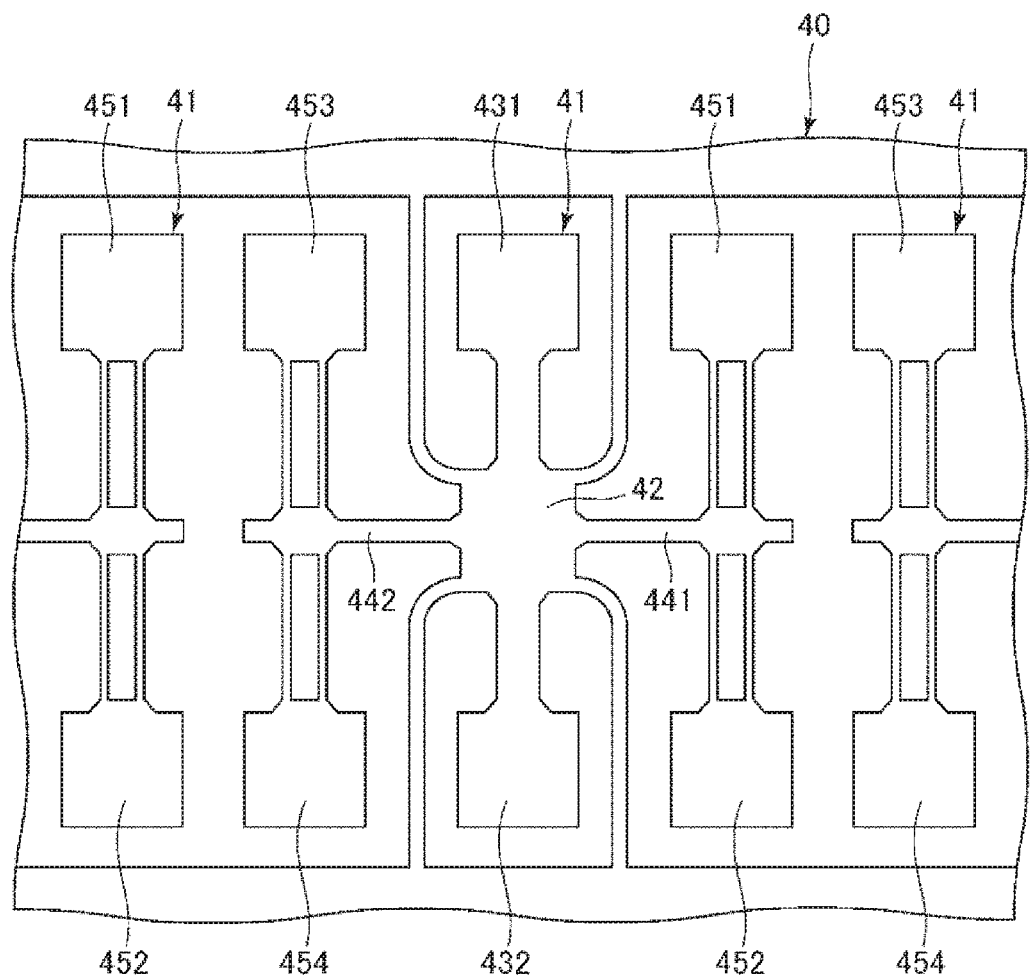
FIG. 13 is a plan view for describing a frequency adjustment method of the vibrator element.
Figure 14:
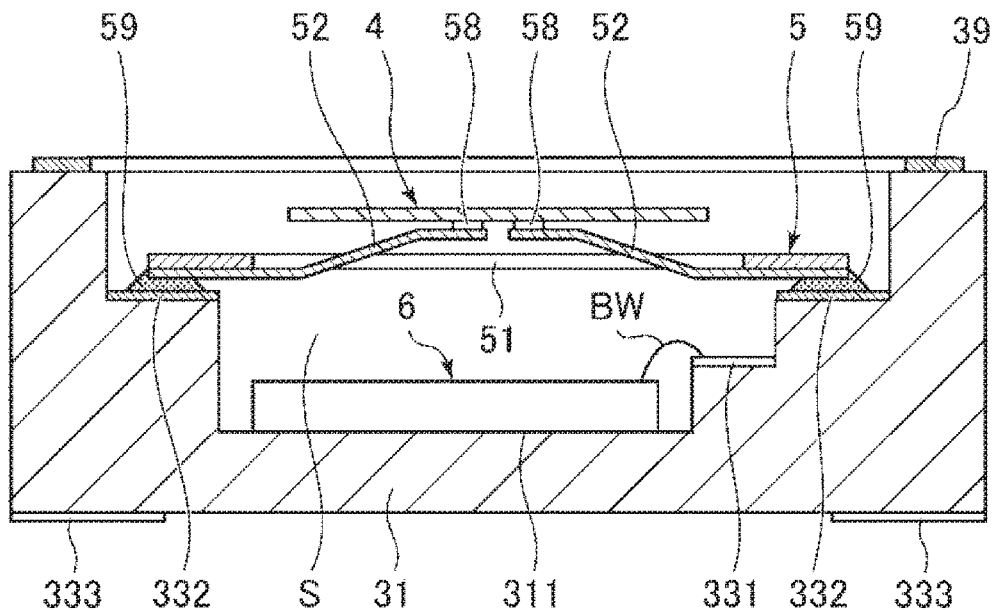
FIG. 14 is a sectional view for describing the frequency adjustment method of the vibrator element.
Figure 15:
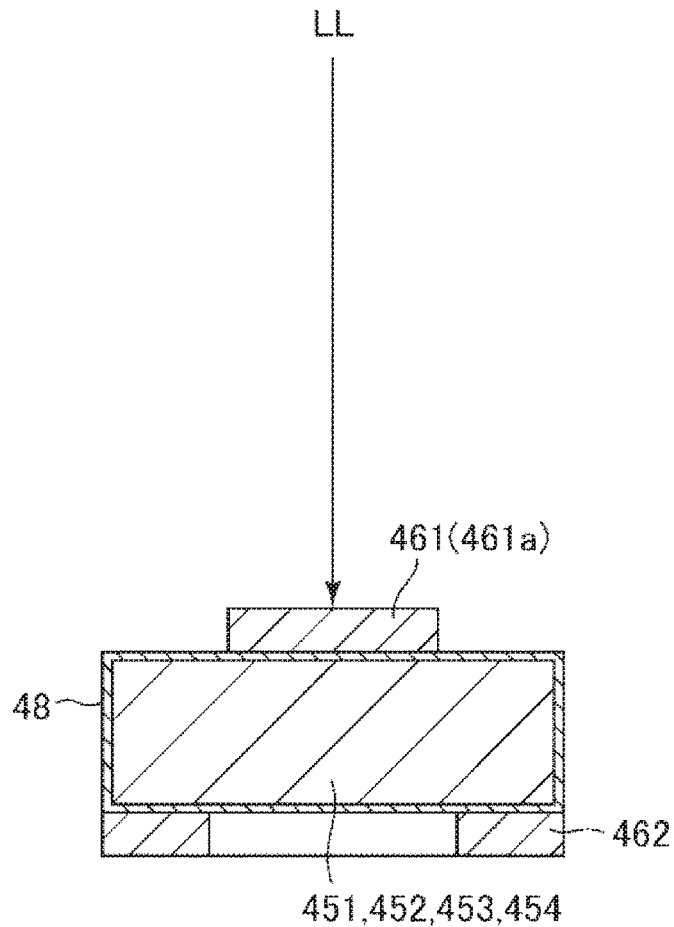
FIG. 15 is a sectional view for describing the frequency adjustment method of the vibrator element.

FIG. 1 is a sectional view of the vibrator according to the first embodiment of the invention. FIG. 2 is a plan view of the vibrator element belonging to the vibrator illustrated in FIG. 1. FIG. 3 is a sectional view taken along line A-A in FIG. 2. FIG. 4 is a sectional view taken along line B-B in FIG. 2. FIG. 5 is a schematic view illustrating a drive vibration mode of the vibrator element illustrated in FIG. 2. FIG. 6 is a schematic view illustrating a detection vibration mode of the vibrator element illustrated in FIG. 2. FIG. 7 is a plan view illustrating a weight of the vibrator element illustrated in FIG. 2. FIG. 8 is a partial enlarged plan view of a drive arm belonging to the vibrator element illustrated in FIG. 2. FIG. 9 is a sectional view taken along line C-C in FIG. 8. FIG. 10 is a plan view of a support substrate belonging to the vibrator illustrated in FIG. 1. FIG. 11 is a plan view illustrating a modification example of the vibrator element illustrated in FIG. 2. FIG. 12 is a flowchart illustrating a frequency adjustment step of the vibrator element. FIG. 13 is a plan view for describing a frequency adjustment method of the vibrator element. FIGS. 14 and 15 are respectively sectional views for describing the frequency adjustment method of the vibrator element. Hereinafter, for convenience of description, three axes orthogonal to each other will be referred to as an X-axis, a Y-axis, and a Z-axis.

A vibrator 1 illustrated in FIG. 1 is an angular velocity sensor device which can detect an angular velocity. In this manner, the vibrator 1 can be very conveniently used for various electronic devices which need to detect postures. This vibrator 1 has a package 3, a vibrator element 4 accommodated inside the package 3, a support substrate 5, and an IC chip 6 (circuit element). In this manner, it is possible to achieve an advantageous effect of the vibrator element 4 as will be described later, and it is possible to obtain the highly reliable vibrator 1.

Package

As illustrated in FIG. 1, the package 3 has a cavity-shaped base 31 having a rectangular shape in a plan view and having a recess portion 311 which is open on an upper surface, and a plate-shaped lid 32 joined (seam-welded) to the upper surface of the base 31 via a seam ring 39 and closing the opening of the recess portion 311. The package 3 has an internal space S formed by closing the opening of the recess portion 311 with the lid 32. The vibrator element 4, the support substrate 5, and the IC chip 6 are accommodated in the internal space S. The internal space S is hermetically sealed, and is in a reduced pressure state (preferably, in a vacuum state). In this manner, viscous resistance is reduced inside the internal space S, and the vibrator element 4 can be efficiently driven. However, an environment of the internal space S is not particularly limited, and may be in an atmospheric pressure state or in a pressurized state.

A groove 321 is formed in the lid 32 so as to allow the inside and the outside of the internal space S to communicate with each other in an unmelted state. In the drawing, the groove 321 is melted by irradiation of an energy ray such as laser light. In this manner, the internal space S is hermetically sealed. The groove 321 is used to replace the atmosphere inside the internal space S. After the atmosphere inside the internal space S is replaced, the groove 321 is sealed after being melted by the irradiation of the laser light. In this manner, the internal space S can easily be set to a desired atmosphere.

A configuration of the lid 32 is not particularly limited. For example, a configuration may be adopted in which the lid 32 has a through-hole penetrating in a thickness direction and allowing the inside and the outside of the internal space S to communicate with each other, and in which the through-hole is sealed with a sealing material.

The base 31 has a plurality of internal terminals 331 and a plurality of internal terminals 332 which are disposed so as to face the internal space S, and a plurality of external terminals 333 disposed on a bottom surface. The respective internal terminals 331 are electrically connected to the IC chip 6 via a bonding wire BW. In the plurality of internal terminals 331, some are electrically connected to the internal terminal 332 via an internal wire (not illustrated) formed in the base 31, and some are electrically connected to the external terminal 333. The respective internal terminals 332 are electrically connected to the support substrate 5 via a conductive joining member 59. The number and arrangement of the internal terminals 331 and 332 and the external terminals 333 are not particularly limited, and may be appropriately set if necessary.

A configuration material of the base 31 is not particularly limited. For example, it is possible to use various ceramics such as oxide ceramics of alumina, silica, titania, and zirconia, or nitride ceramics of silicon nitride, aluminum nitride, and titanium nitride. A configuration material of the lid 32 is not particularly limited. However, it is preferable to use a member having a linear expansion coefficient close to that of the configuration material of the base 31. For example, in a case where the configuration material of the base 31 is set to ceramics as described above, it is preferable that the configuration material of the lid 32 is a metal material (for example, an alloy such as Kovar).

Vibrator Element

The vibrator element 4 is the angular velocity sensor element which can detect an angular velocity ωz around the Z-axis. This vibrator element 4 has a vibrator body 41 as illustrated in FIG. 2. The vibrator body 41 is formed using a Z cut quartz crystal plate. The vibrator body 41 has a spread in an XY plane defined by the X-axis (electrical axis) and the Y-axis (mechanical axis) which are quartz crystal axes, and has a thickness in a direction of the Z-axis (optical axis).

As illustrated in FIG. 2, the vibrator body 41 has a base portion 42, detection arms 431 and 432 extending toward both sides in the direction of the Y-axis from the base portion 42, connection arms 441 and 442 extending toward both sides in the direction of the X-axis from the base portion 42, drive arms 451 and 452 extending toward both sides in the direction of the Y-axis from a distal end portion of the connection arm 441, and drive arms 453 and 454 extending toward both sides in the direction of the Y-axis from a distal end portion of the connection arm 442.

Hereinafter, the base portion 42, a connection portion between the connection arm 441 and the drive arms 451 and 452, a portion between the base portion 42 of the connection arm 441 and the connection portion, a connection portion between the connection arm 442 and the drive arms 453 and 454, and a portion between the base portion 42 of the connection arm 442 and the connection portion are referred to as a base portion 420. This base portion 420 mainly functions as a base portion for supporting the drive arms 451, 452, 453, and 454.

The respective drive arms 451, 452, 453, and 454 have wide portions 451a, 452a, 453a, and 454a (hammer heads) having a width (length in the direction of the X-axis) wider than that of a proximal end side, in a distal end portion thereof. The respective detection arms 431 and 432 have wide portions 431a and 432a (hammer heads) having a width wider than that of a proximal end portion, in a distal end portion thereof. In this manner, in a case of being compared using the same frequency, the drive arms 451, 452, 453, and 454 and the detection arms 431 and 432 can be shortened, and thus, the vibrator element 4 can be downsized. As the length of the drive arm 451, 452, 453, and 454 is shortened, viscous resistance is reduced. Accordingly, oscillation characteristics (Q-value) are improved. However, each configuration of the respective drive arms 451, 452, 453, and 454 and the respective detection arms 431 and 432 is not limited thereto. For example, the configuration may not have the wide portion.

As illustrated in FIG. 3, the drive arm 451 has a groove 451b formed on the upper surface and a groove 451c formed on the lower surface. As illustrated in FIG. 4, the drive arm 452 has a groove 452b formed on the upper surface and a groove 452c formed on the lower surface. As illustrated in FIG. 3, the drive arm 453 has a groove 453b formed on the upper surface and a groove 453c formed on the lower surface. As illustrated in FIG. 4, the drive arm 454 has a groove 454b formed on the upper surface and a groove 454c formed on the lower surface. In this manner, thermo-elastic loss is reduced in a drive vibration mode (to be described later), and the Q-value of the vibrator element 4 can be improved. The present embodiment is not limited thereto. For example, the respective drive arms 451, 452, 453, and 454 may not have the groove.

As illustrated in FIG. 2, the vibrator element 4 has an electrode 48 placed in the vibrator body 41. The electrode 48 has a drive signal electrode 481, a drive ground electrode 482, a first detection signal electrode 483, a first detection ground electrode 484, a second detection signal electrode 485, and a second detection ground electrode 486.

The drive signal electrode 481 is placed on the upper surface and the lower surface of the drive arms 451 and 452 and on both side surfaces of the drive arms 453 and 454. On the other hand, the drive ground electrode 482 is placed on both side surfaces of the drive arms 451 and 452 and on the upper surface and the lower surface of the drive arms 453 and 454.

The first detection signal electrode 483 is placed on the upper surface and the lower surface of the detection arm 431, and the first detection ground electrode 484 is placed on both side surfaces of the detection arm 431. On the other hand, the second detection signal electrode 485 is placed on the upper surface and the lower surface of the detection arm 432, and the second detection ground electrode 486 is placed on both side surfaces of the detection arm 432. The electrodes 481, 482, 483, 484, 485, and 486 are respectively pulled around to the base portion 42, and are electrically connected to the support substrate 5 in the base portion 42.

A configuration of the electrode 48 is not particularly limited. For example, the electrode 48 can be configured to include a metal film obtained by stacking gold (Au), aluminum (Al), or an alloy whose main component is gold (Au) or aluminum (Al) on an underlayer of chromium (Cr) or nickel (Ni).

The vibrator element 4 can detect the angular velocity ωz around the Z-axis serving as the detection axis as follows. First, if a drive signal is applied between the drive signal electrode 481 and the drive ground electrode 482, the drive arms 451, 452, 453, and 454 are vibrated in a drive vibration mode as illustrated in FIG. 5. If the angular velocity ωz around the Z-axis is applied to the vibrator element 4 in a state where the vibrator element 4 is driven in the drive vibration mode, a detection vibration mode as illustrated in FIG. 6 is newly excited. In the detection vibration mode, the Coriolis force acts on the drive arms 451, 452, 453, and 454 so as to excite the vibration in a direction indicated by an arrow A. In response to this vibration, the detection arms 431 and 432 perform flexural vibration in a direction indicated by an arrow B (in the direction of the X-axis). A charge generated in the detection arms 431 and 432 due to the detection vibration mode is taken out as a detection signal from between the first and second detection signal electrodes 483 and 485 and the first and second detection ground electrodes 484 and 486. Based on this signal, the angular velocity ωz can be detected.

Here, a frequency (resonance frequency of the drive arms 451, 452, 453, and 454) fd in the drive vibration mode and a frequency (resonance frequency of the detection arms 431 and 432) fs in the detection vibration mode are set to be different from each other. An absolute value (|fd−fs|) of a difference therebetween will be referred to as a "detuning frequency Δf". Any relationship of fd>fs and fd<fs may be satisfied.

As illustrated in FIG. 7, the vibrator element 4 has weights 46 and 47 placed in the vibrator body 41. The weight 46 is disposed in the wide portions 451a, 452a, 453a, and 454a of the respective drive arms 451, 452, 453, and 454, and the weight 47 is disposed in the wide portions 431a and 432a of the respective detection arms 431 and 432. The weight 46 is disposed in order to adjust the frequency of the drive arms 451, 452, 453, and 454, and the weight 47 is disposed in order to adjust the frequency of the detection arms 431 and 432. For convenience of description, illustration of the weights 46 and 47 is omitted in FIG. 2, and illustration of the electrode 48 is omitted in FIG. 7.

First, the weight 46 will be described. A configuration of the weight 46 is the same as that of the drive arms 451, 452, 453, and 454. Therefore, hereinafter, for convenience of description, the weight 46 disposed in the drive arm 451 will be described as a representative example. The weight 46 disposed in the other the drive arms 452, 453, and 454 will be omitted in the description.

As illustrated in FIGS. 8 and 9, the weight 46 has a first weight 461 placed on one principal surface (positive side principal surface when the direction of the Z-axis is set as a normal direction) of the wide portion 451a and a second weight 462 placed on the other principal surface (negative side principal surface when the direction of the Z-axis is set as the normal direction) of the wide portion 451a. That is, the weight 46 is placed on both surfaces of the wide portion 451a. To be more accurate, the first weight 461 is placed on the electrode 48 placed on the upper surface of the wide portion 451a, and the second weight 462 is placed on the electrode 48 placed on the lower surface of the wide portion 451a.

The first weight 461 and the second weight 462 may be reversely placed. That is, the first weight 461 may be placed on the negative side principal surface of the wide portion 451a in the direction of the Z-axis, and the second weight 462 may be placed on the positive side principal surface.

In a plan view in the direction of the Z-axis (normal direction of both principal surfaces of the wide portion 451a), the first weight 461 has a non-overlapping region 461a which does not overlap the second weight 462. According to the present embodiment, the first weight 461 does not overlap the second weight 462 in an entire area thereof, and the entire area is configured to include the non-overlapping region 461a. However, a configuration of the first weight 461 is not particularly limited as long as the configuration has the non-overlapping region 461a. For example, a portion of the first weight 461 may overlap the second weight 462.

In the first and second weights 461 and 462, the first weight 461 mainly has a function to adjust the frequency fd. More specifically, as will be described later in a frequency adjustment method, the frequency fd is adjusted by irradiating the first weight 461 with laser light LL and decreasing the mass of the first weight 461.

On the other hand, the second weight 462 mainly has a function to reduce vibration leakage of the vibrator element 4 by maintaining the mass balance with the first weight 461. Specifically, in a case where the weight 46 is configured to include only the first weight 461, a centroid of the whole drive arm 451 including the weight 46 deviates to the upper surface side (first weight 461 side). Therefore, in the drive vibration mode, the drive arm 451 is vibrated in the direction of the Z-axis (unnecessary vibration), thereby causing the vibration leakage. Therefore, in the vibrator element 4, the second weight 462 is disposed on a side opposite to the first weight 461, thereby reducing the above-described deviation of the centroid. In this manner, the vibration (unnecessary vibration) of the drive arm 451 in the direction of the Z-axis in the drive vibration mode can be suppressed, and the vibration leakage can be reduced.

The first weight 461 is located at a central portion of the wide portion 451a except for an edge portion of the wide portion 451a. Specifically, in a plan view in the direction of the Z-axis, when an imaginary line passing through the center in the width direction (in the direction of the X-axis) of the drive arm 451 and extending in the direction of the Y-axis is set as a center line L, the first weight 461 is placed so as to overlap the center line L. In this way, since the first weight 461 is placed in the central portion of the wide portion 451a, the first weight 461 is likely to be irradiated with the laser light LL (refer to FIG. 15). The first weight 461 is partially removed by being irradiated with the laser light LL. As a result, even if there is a difference in the mass of the first weight 461 on both sides of the center line L, it is possible to minimize the moment of inertia around the central axis of the drive arm 451 which is generated by the difference. Therefore, torsional vibration (unnecessary vibration) on the Y-axis of the drive arm 451 in the drive vibration mode can be effectively suppressed. However, placing the first weight 461 is not particularly limited. For example, the first weight 461 may be placed in the edge portion of the wide portion 451a.

As described above, the first weight 461 is used in order to adjust the frequency fd by being irradiated with the laser light LL and partially removing the first weight 461. Therefore, as illustrated in FIG. 8, an irradiation trace R of the laser light LL is formed in the first weight 461. However, in a case where the frequency fd falls within a target range from the beginning, it is not necessary to irradiate the first weight 461 with the laser light LL. Therefore, the irradiation trace R may not be formed.

On the other hand, the second weight 462 is placed along the edge portion of the wide portion 451a except for the central portion of the wide portion 451a. According to the present embodiment, the second weight 462 is placed along an edge portion 451a' on the distal end side of the wide portion 451a and an edge portion 451a'' on both sides in the direction of the X-axis. The second weight 462 is placed in the edge portion of the wide portion 451a with respect to the first weight 461 placed in the central portion of the wide portion 451a. Accordingly, the non-overlapping region 461a can be easily formed in the first weight 461. The second weight 462 can be sufficiently widely placed, and the mass balance can be easily maintained between the first weight 461 and the second weight 462. However, placing the second weight 462 is not particularly limited. For example, the second weight 462 may be placed in the central portion of the wide portion 451a.

As described above, the second weight 462 is disposed in order to reduce the vibration leakage of the vibrator element 4 by maintaining the mass balance with the first weight 461. Therefore, unlike the first weight 461, the second weight 462 is not irradiated with the laser light LL. That is, the irradiation trace R of the laser light LL is not formed in the second weight 462. In this way, the second weight 462 is not irradiated with the laser light LL. Accordingly, even if the second weight 462 is placed in the edge portion of the wide portion 451a which is a region less likely to be irradiated with the laser light LL, it is not complicated or difficult to adjust the frequency fd. However, the second weight 462 may be used for adjusting the frequency fd. In this case, the second weight 462 is irradiated with the laser light LL, thereby forming the irradiation trace R.

When the mass of the first weight 461 is set to m1 and the mass of the second weight 462 is set to m2, m1 and m2 satisfy a relationship |m1−m2|<m1. In particular, according to the present embodiment, m1 and m2 are substantially equal to each other. As illustrated in FIG. 9, in a cross-sectional view perpendicular to the extending direction of the drive arm 451, when the thickness (length in the direction of the Z-axis) of the drive arm 451 is set to T and a separation distance in the direction of the Z-axis between a centroid G1 of the weight 46 including the first weight 461 and the second weight 462 and a centroid G2 of the drive arm 451 is set to D, a relationship of 0≤D≤0.2T is satisfied. According to the present embodiment, the drive arm 451 is formed to be substantially vertically symmetrical. Therefore, the centroid G2 substantially coincides with the center in the thickness direction of the drive arm 451.

Since this relationship is satisfied, the centroid of the whole drive arm 451 including the weight 46 and the electrode 48 can coincide with an XY-plane F intersecting the centroid G2 of the drive arm 451, or can be located in the vicinity of the XY-plane F. Therefore, it is possible to effectively suppress the vibration (unnecessary vibration) of the drive arm 451 in the direction of the Z-axis in the drive vibration mode. As a result, the occurrence of the unnecessary vibration (vibration in the direction other than the direction of the X-axis) in the drive vibration mode is suppressed, and the vibration leakage of the vibrator element 4 can be effectively suppressed.

On the other hand, in a case where the relationship of 0≤D≤0.2T is not satisfied, that is, in a case of D>0.2T, the centroid of the whole drive arm 451 including the weight 46 is greatly separated from the centroid G2 of the drive arm 451. Therefore, the mass balance of the whole drive arm 451 including the weight 46 greatly collapses in the direction of the Z-axis, and the drive arm 451 is likely to be vibrated in the direction of the Z-axis in the drive vibration mode. Therefore, it is not possible to sufficiently suppress the unnecessary vibration (vibration in the direction other than the direction of the X-axis) in the drive vibration mode, and the vibration leakage of the vibrator element 4 increases.

As a relationship between the thickness T and the separation distance D, the relationship of 0≤D≤0.2T may be satisfied. However, it is preferable that the relationship of 0≤D≤0.1T is further satisfied. It is more preferable that the relationship of 0≤D≤0.05T is satisfied. In this manner, the above-described advantageous effect is more remarkably achieved.

The first weight 461 is placed on the upper surface of the wide portion 451a, and the second weight 462 is placed on the lower surface of the wide portion 451a. In this manner, stress caused by the first weight 461 acts on the upper surface of the wide portion 451a, and stress caused by the second weight 462 acts on the lower surface of the wide portion 451a. Therefore, it is possible to maintain balance between the stress acting on the upper surface of the wide portion 451a and the stress acting on the lower surface of the wide portion 451a, and it is possible to reduce warpage of the wide portion 451a in the direction of the Z-axis. From this point of view as well, it is possible to effectively suppress the vibration (unnecessary vibration) of the drive arm 451 in the direction of the Z-axis in the drive vibration mode.

According to the present embodiment, the first weight 461 and the second weight 462 are respectively placed symmetrically with respect to the center line L before laser irradiation. In this manner, the masses of the weight 46 on both sides of the center line L can be set to be substantially equal to each other. Therefore, the drive arm 451 can be vibrated in the direction in the X-axis in a well-balanced manner. However, the invention is not limited thereto, and the first weight 461 and the second weight 462 may be placed asymmetrically with respect to the center line L in a plan view. However, even in this case, when the weight 46 is viewed as a whole, it is preferable that the masses on both sides of the center line L are substantially equal to each other.

As illustrated in FIG. 8, it is preferable that a width W1 (length in the direction of the X-axis) of the first weight 461 and a width W2 (length in the direction of the X-axis) of the second weight 462 are respectively equal to or wider than ½ of a width W (length in the direction of the X-axis) of the wide portion 451a, and more preferably in a range of ½ to %10. In this manner, the weight 46 can increase rigidity (particularly, torsional rigidity) of the wide portion 451a. It is possible to maintain the balance between the stress applied to the upper surface of the wide portion 451a by the first weight 461 and the stress applied to the lower surface of the wide portion 451a by the second weight 462, and it is possible to more effectively suppress the warpage of the wide portion 451a. For example, the width W1 means the maximum separation distance between both end portions in the direction of the X-axis of the first weight 461. For example, the width W2 means the maximum separation distance between both end portions in the direction of the X-axis of the second weight 462.

Next, the weight 47 will be described. The weight 47 is disposed mainly in order to adjust the frequency fs in the detection vibration mode. The frequency fs can be adjusted by irradiating the weight 47 with the laser light LL, partially removing the weight 47, and reducing the mass of the detection arms 431 and 432.

As illustrated in FIG. 7, the weight 47 is placed on one principal surface (positive side principal surface in the direction of the Z-axis) of the wide portions 431a and 432a. That is, unlike the weight 46, the weight 47 is not placed on both surfaces of the wide portions 431a and 432a. The reason is as follows. The detection arms 431 and 432 are not substantially vibrated in the drive vibration mode. Accordingly, even if the mass balance of the detection arms 431 and 432 is collapsed in the direction of the Z-axis by the weight 47, the vibration leakage is not affected. Therefore, the weight 47 is placed only one principal surface of the wide portions 431a and 432a. In this manner, compared to a case where the weight 47 is placed on both surfaces, the weight 47 is more simply placed. However, without being limited thereto, the weight 47 may be placed on the negative side principal surface in the direction of the Z-axis, or the weight 47 may be placed on both surfaces of the wide portions 431a and 432a, similar to the weight 46.

A configuration material of the weights 46 and 47 is not particularly limited. For example, it is possible to use gold (Au) or an alloy containing gold (Au) as a main component. It is preferable that the thickness of the first weight 461, the second weight 462, and the weight 47 is sufficiently thicker than the thickness of the electrode 48. For example, the thickness can be set to be in a range of 0.5 μm to 10 μm. In this manner, a proper amount of the mass of the weights 46 and 47 is removed once by being irradiated with the laser light LL, and the frequencies fd and fs can be efficiently and easily adjusted.

It is preferable that the thickness of the first weight 461 and the thickness of the second weight 462 are substantially equal to each other. In this manner, only in view of an area, it is possible to maintain the mass balance between the first weight 461 and the second weight 462. Therefore, the vibrator element 4 can be more easily designed and manufactured. However, the weight 46 (first and second weights 461 and 462) and the weight 47 may have a uniform thickness over the entire formation region, or may have regions having mutually different thicknesses.

Hitherto, the vibrator element 4 has been described. As described above, the vibrator element 4 includes the base portion 420, the drive arm 451 serving as the vibrating arm extending in the direction of the Y-axis (first direction) from the base portion 420, the first weight 461 placed on one principal surface (upper surface) of the drive arm 451, and the second weight 462 placed on the other principal surface of the drive arm 451. In a plan view in the normal direction of the principal surface, the first weight 461 has the non-overlapping region 461a which does not overlap the second weight 462, at the position including the center in the width direction of the drive arm 451. In a cross-sectional view of the drive arm 451, when the thickness of the drive arm 451 is set to T and the separation distance in the thickness direction of the vibrating arm 451 between the centroid G1 of the weight 46 including the first weight 461 and the second weight 462 and the centroid G2 of the drive arm 451 is set to D, the relationship of $0 \leq D \leq 0.2T$ is satisfied. In this manner, as described above, the occurrence of the unnecessary vibration (vibration in the direction other than the direction of the X-axis) in the drive vibration mode is suppressed. Therefore, it is possible to effectively suppress the vibration leakage of the vibrator element 4.

As described above, in the vibrator element 4, the first weight 461 and the second weight 462 are respectively disposed in the distal end region on a side opposite to the base portion 420, which is the wide portion 451a whose size in the width direction of the drive arm 451 (second direction orthogonal to the first direction and parallel to the principal surface, that is, the direction of the X-axis) is larger than that of the base portion 420 side. The length of the first weight 461 in the direction of the X-axis and the length of the second weight 462 in the direction of the X-axis are respectively equal to or longer than ½ of the length of the wide portion 451a in the direction of the X-axis. In this manner, the weight 46 can increase the rigidity (particularly, torsional rigidity) of the wide portion 451a. It is possible to minimize the difference between the stress applied to the upper surface of the wide portion 451a by the first weight 461 and the stress applied to the lower surface of the wide portion 451a by the second weight 462, and it is possible to more effectively suppress the warpage of the wide portion 451a. The present embodiment is not limited thereto. For example, at least one of the length of the first weight 461 in the direction of the X-axis and the length of the second weight 462 in the direction of the X-axis may be equal to or longer than ½ of the length of the wide portion 451a in the direction of the X-axis.

Support Substrate

The support substrate 5 (substrate) is disposed for mounting tape automated bonding (TAB) known in the related art. As illustrated in FIG. 10, the support substrate 5 has a frame-shaped base portion 51 and a plurality (six in the present embodiment) of leads 52 (wiring portions) disposed in the base portion 51. The base portion 51 is fixed to the base 31 by a conductive joining member 59. Furthermore, the lead 52 and an internal terminal 332 are electrically connected to each other via the joining member 59. The base portion 42 of the vibrator element 4 is fixed to the distal end portion of each lead 52 by a conductive joining member 58, and the lead 52 and each of electrodes 481 to 486 are electrically connected to each other. Therefore, the vibrator element 4 is supported by the base 31 via the support substrate 5, and is electrically connected to the IC chip 6.

IC Chip

As illustrated in FIG. 1, the IC chip 6 (circuit element) is fixed to the bottom surface of the recess portion 311. For example, the IC chip 6 includes an interface unit which communicates with an external host device, and a drive/detection circuit which drives the vibrator element 4 so as to detect the angular velocity ωz applied to the vibrator element 4.

Hitherto, the vibrator 1 has been described. The vibrator 1 is not particularly limited. For example, the support substrate 5 may be omitted, and the vibrator element 4 may be fixed to the base 31 or the IC chip 6. In a case where the vibrator element 4 is fixed to the base 31, the base 31 corresponds to the "substrate" according to the invention. In a case where the vibrator element 4 is fixed to the IC chip 6, the IC chip 6 corresponds to the "substrate" according to the invention.

According to the present embodiment, an angular velocity sensor element is used as the vibrator element 4, and the vibrator 1 is used as an angular velocity sensor device. However, the present embodiment is not limited thereto. For example, an accelerometer element may be used as the vibrator element 4, the vibrator 1 may be used as an acceleration sensor device. An oscillator element may be used as the vibrator element 4, and the vibrator 1 may be used as an oscillator.

A configuration of the vibrator element 4 is not particularly limited. For example, as illustrated in FIG. 11, corner portions of the respective wide portions 431a, 432a, 451a, 452a, 453a, and 454a may be chamfered. In FIG. 11, for convenience of description, the electrode 48 and the weights 46 and 47 are omitted in the illustration.

For example, one or three of the drive arms 451, 452, 453, and 454 may be omitted, or another drive arm may be provided. Similarly, one of the detection arms 431 and 432 may be omitted, or another detection arm may be provided. The detection axis of the vibrator element 4 is not limited to the Z-axis. For example, the detection axis may be the X-axis or the Y-axis. A plurality of the detection axes may be provided among the X-axis, the Y-axis, and the Z-axis.

Next, a frequency adjustment method (manufacturing method of the vibrator 1) of the vibrator element 4 will be described. As illustrated in FIG. 12, the frequency adjustment method of the vibrator element 4 includes a preparation step of preparing the vibrator element 4, a first frequency adjustment step of adjusting the frequency of the vibrator element 4 on the quartz crystal wafer 40, a mounting step of mounting the vibrator element 4 on the package 3, a second frequency adjustment step of adjusting the frequency of the vibrator element 4, and a sealing step of sealing the package 3.

Preparation Step

First, as illustrated in FIG. 13, the quartz crystal wafer 40 is prepared, and the quartz crystal wafer 40 is patterned using a photolithography technique and an etching technique, thereby forming a plurality of vibrator bodies 41 on the quartz crystal wafer 40. Next, the electrode 48 is formed on the surface of the vibrator body 41 by means of sputtering. Furthermore, the weight 46 (the first weight 461 and the second weight 462) is formed in the respective wide portions 451a, 452a, 453a, and 454a by means of sputtering, and the weight 47 is formed in the wide portions 431a and 432a.

Here, in this step, the weight 46 is formed so that the mass of the first weight 461 is greater than the mass of the second weight 462. As described above, only the first weight 461 in the first and second weights 461 and 462 is partially removed later by being irradiated with the laser light LL. Therefore, in anticipation, the mass of the first weight 461 is further increased than the mass of the second weight 462. In this manner, it is possible to minimize the difference between the mass of the first weight 461 after being irradiated with the laser light LL and the mass of the second weight 462. As a result, it is possible to more effectively suppress the unnecessary vibration in the drive vibration mode, and it is possible to suppress the vibration leakage of the vibrator element 4. The difference between the mass of the first weight 461 and the mass of the second weight 462 is not particularly limited. However, it is preferable that the difference is substantially equal to the mass removed from the first weight 461 by being irradiated with the laser light LL. The mass removed from the first weight 461 by being irradiated with the laser light LL can be calculated in advance from experiments or simulations, for example.

In the vibrator element 4 prepared in this step, the first weight 461 placed in the drive arm 451 is placed in the central portion of the wide portion 451a (refer to FIG. 8). That is, the first weight 461 is placed at an area including the center line L of the drive arm 451. In this manner, the first weight 461 is likely to be irradiated with the laser light LL. The first weight 461 placed in the drive arms 452, 453, and 454 has the same configuration.

In the vibrator element 4 prepared in this step, the second weight 462 placed in the drive arm 451 avoids the central portion of the wide portion 451a, and is placed along an edge portion 451a' on the distal end side and an edge portion 451a" on both sides in the direction of the X-axis (refer to FIG. 8). That is, the second weight 462 is located at an area including both side portions across the center in the width direction of the drive arm 451. In this manner, the non-overlapping region 461a can be easily disposed in the first weight 461. The second weight 462 can be placed so as to be sufficiently wide, and it is possible to easily maintain the mass balance between the first weight 461 and the second weight 462.

First Frequency Adjustment Step

Next, the frequencies fd and fs of the vibrator element 4 are roughly adjusted on the quartz crystal wafer 40. More specifically, if necessary, the first weight 461 disposed in the drive arms 451, 452, 453, and 454 is irradiated with the laser light LL (energy ray), and the first weights 461 is partially removed so as to reduce the mass. In this manner, the frequency fd in the drive vibration mode is adjusted (for example, roughly adjusted so that the variation in the frequency is approximately 500 ppm). Similarly, if necessary, the weight 47 disposed in the detection arms 431 and 432 is irradiated with the laser light LL, and the weight 47 is partially removed so as to reduce the mass. In this manner, the frequency fs in detection vibration mode is adjusted. The laser light LL is not particularly limited. For example, it is possible to use pulsed laser light such as YAG, YVO4, excimer laser or continuous oscillation laser light such as carbon dioxide gas laser. The energy ray is not limited to the laser light LL, and for example, an electron beam may be used.

In this way, the frequencies fd and fs are adjusted on the quartz crystal wafer 40, that is, before the vibrator element 4 is joined to the package 3. Accordingly, it is possible to suppress an adverse effect caused by the weights 46 and 47 evaporated during the adjustment and adhering to the package 3. According to the present embodiment, the frequency fd is adjusted by partially removing the first weight 461 disposed in the drive arms 451, 452, 453, and 454. However, the present embodiment is not limited thereto. The frequency fd may be adjusted by partially removing the second weight 462, or the frequency fd may be adjusted by partially removing the first and second weights 461 and 462.

Mounting Step

Next, as illustrated in FIG. 14, the vibrator element 4 is cut off from the quartz crystal wafer 40, and is joined to the base 31 via the support substrate 5. In this case, the vibrator element 4 is placed so that the first weight 461 faces the lid 32 side and the second weight 462 faces the bottom surface side of the base 31. In this way, if the vibrator element 4 is accommodated in the package 3, the frequency fd in the drive vibration mode of the vibrator element 4 is changed due to an environmental change such as stress.

Second Frequency Adjustment Step

As described above, the frequency fd is changed in the mounting step. Accordingly, in this step, the frequency fd is adjusted again by using the laser light LL and partially removing the first weight 461.

Specifically, as illustrated in FIG. 15, the first weight 461 (non-overlapping region 461a) of the drive arms 451, 452, 453, and 454 is irradiated with the laser light LL so that the frequency fd is set to a target value. In this step, the second weight 462 is not irradiated with the laser light LL, and the second weight 462 is not partially removed by the laser light LL. Therefore, the following advantageous effect can be achieved.

Irradiating with the laser light LL is performed in a device including a discharge port in the vicinity of the opening of the base 31 under atmospheric pressure. The first weight 461 is placed on the upper surface (surface on the lid 32 side) of the vibrator element 4. Accordingly, the splash (dross) evaporated by the laser irradiation is likely to be discharged outward of the package 3 via the opening of the base 31 by the airflow directed to the discharge port. In contrast, the second weight 462 is placed on the lower surface of the vibrator element 4. Accordingly, the splash (dross) evaporated by the laser irradiation is less likely to be discharged outward of the package 3, compared to the splash of the first weight 461. Therefore, only the first weight 461 is irradiated with the laser light. In this manner, the splash of the first weight 461 is less likely to remain in the package 3.

If the splash of the weight 46 which remains in the package 3 adheres to the support substrate 5 or the base 31, for example, a short circuit occurs between the leads 52, a short circuit occurs between the internal terminals 331, or unintended parasitic capacitance is formed. Consequently, the electrical characteristics of the vibrator 1 become poor. In particular, the lower surface of the vibrator element 4 having the second weight 462 faces the bottom surface of the support substrate 5 and the base 31. Accordingly, the splash evaporated from the second weight 462 is likely to adhere to the support substrate 5 or the base 31, thereby causing a possibility that the above-described problem may arise. If the splash adhering to the support substrate 5 or the base 31 is detached once due to an impact and adheres again to the vibrator element 4, there is a possibility that a short circuit may occur between the electrodes or that the vibration characteristics may become poor due to a change in the mass.

In this way, only the first weight 461 is irradiated with the laser light LL, and the second weight 462 is not irradiated with the laser light LL. In this manner, the splash of the weight 46 is less likely to remain in the package 3. Therefore, it is possible to effectively suppress the poor electrical characteristics of the vibrator 1 and the poor vibration characteristics (including a temporal change) of the vibrator element 4.

The electrode 48 placed on the lower surface of the wide portion 451a is irradiated with the laser light LL penetrating the first weight 461, thereby causing a possibility that the electrode 48 may be evaporated. However, the electrode 48 is formed to be sufficiently thin, compared to the second weight 462. Accordingly, the evaporated amount is extremely small. Therefore, even if the electrode placed on the lower surface of the wide portion 451a is partially evaporated, the above-described problem caused by the evaporated second weight 462 does not substantially arise. The irradiation with the laser light LL may be performed under vacuum inside a vacuum device, not under the atmospheric pressure.

Upon completion of this step, when the thickness (length in the direction of the Z-axis) of the drive arm 451 is set to T and the separation distance in the direction of the Z-axis between the centroid G1 of the weight 46 including the first weight 461 and the second weight 462 and the centroid G2 of the drive arm 451 is set to D, the relationship of $0 \le D \le 0.2T$ is satisfied. The drive arms 452, 453, and 454 have the same configuration. In this manner, as described above, it is possible to effectively suppress the vibration (unnecessary vibration) of the drive arm 451 in the direction of the Z-axis in the drive vibration mode. As a result, the occurrence of the unnecessary vibration (vibration in the direction other than the direction of the X-axis) in the drive vibration mode is suppressed. Therefore, it is possible to effectively suppress the vibration leakage of the vibrator element 4.

Sealing Step

Next, the lid 32 is joined to the base 31 by performing seam welding of the lid 32 on the upper surface of the base 31 via the seam ring 39. Next, the package 3 is internally brought into a reduced pressure state via the groove 321 of the lid 32, and the groove 321 is closed by irradiating the groove 321 with the laser light so as to melt the groove 321. In this manner, the internal space S is hermetically sealed, and the vibrator 1 is obtained.

Hitherto, the frequency adjustment method of the vibrator element 4 has been described. As described above, the frequency adjustment method of the vibrator element 4 has the step (preparation step) of preparing the vibrator element 4 which has the drive arms 451, 452, 453, and 454 (vibrating arms), the first weight 461 placed on the upper surface (one principal surface) of the drive arms 451, 452, 453, and 454, and the second weight 462 placed on the lower surface (the other principal surface) of the drive arms 451, 452, 453, and 454, and in which in a plan view in the normal direction of the principal surface, the first weight 461 has the non-overlapping region 461a which does not overlap the second weight 462, the step (mounting step) of preparing the support substrate 5 (substrate) including the lead 52 (wiring portion), and fixing the vibrator element 4 to the support substrate 5 by causing the lower surface side of the vibrator element 4 to face the support substrate 5 side, and the step (second frequency adjustment step) of irradiating the non-overlapping region 461a of the first weight 461 with the laser light LL (energy ray) from the upper surface side, removing a portion of the non-overlapping region 461a of the first weight 461, and adjusting the resonance frequency of the drive arms 451, 452, 453, and 454. In this manner, as described above, the splash of the weight 46 is less likely to adhere to the support substrate 5. Therefore, it is possible to effectively suppress the poor electrical characteristics of the vibrator 1 and the poor vibration characteristics (including a temporal change) of the vibrator element 4.

As described above, in the vibrator element 4 prepared in the preparation step, the first weight 461 is placed at an area including the center in the width direction of the drive arms 451, 452, 453, and 454 in a plan view. In this manner, the first weight 461 is likely to be irradiated with the laser light LL in the respective drive arms 451, 452, 453, and 454.

As described above, in the vibrator element 4 prepared in the preparation step, the second weight 462 is placed at an area including both side portions across the center in the width direction of the drive arm 451, 452, 453, and 454 in a plan view. In this manner, the non-overlapping region 461*a* can be easily disposed in the first weight 461. The second weight 462 can be placed so as to be sufficiently wide, and it is possible to easily maintain the mass balance between the first weight 461 and the second weight 462.

As described above, in the preparation step, the mass of the first weight 461 is greater than the mass of the second weight 462. In this manner, it is possible to minimize the difference between the mass of the first weight 461 and the mass of the second weight 462 after the second frequency adjustment step is performed. As a result, it is possible to more effectively suppress the unnecessary vibration in the drive vibration mode, and it is possible to suppress the vibration leakage of the vibrator element 4.

As described above, in the second frequency adjustment step, in a cross-sectional view of the drive arms 451, 452, 453, and 454, when the thickness of the drive arms 451, 452, 453, and 454 is set to T and the separation distance in the thickness direction of the vibrating arms 451, 452, 453, and 454 between the centroid G1 of the weight 46 including the first weight 461 and the second weight 462 and the centroid G2 of the drive arms 451, 452, 453, and 454 is set to D, the first weight 461 is partially removed so as to satisfy the relationship of $0 \leq D \leq 0.2T$. In this manner, as described above, it is possible to effectively suppress the vibration (unnecessary vibration) of the drive arms 451, 452, 453, and 454 in the direction of the Z-axis in the drive vibration mode. As a result, the occurrence of the unnecessary vibration (vibration in the direction other than the direction of the X-axis) in the drive vibration mode is suppressed. Therefore, it is possible to effectively suppress the vibration leakage of the vibrator element 4.

The frequency adjustment method of the vibrator element 4 is not particularly limited. For example, the first frequency adjustment step or the sealing step may be omitted.

Second Embodiment

Next, a vibrator according to a second embodiment of the invention will be described.

Figure 16:
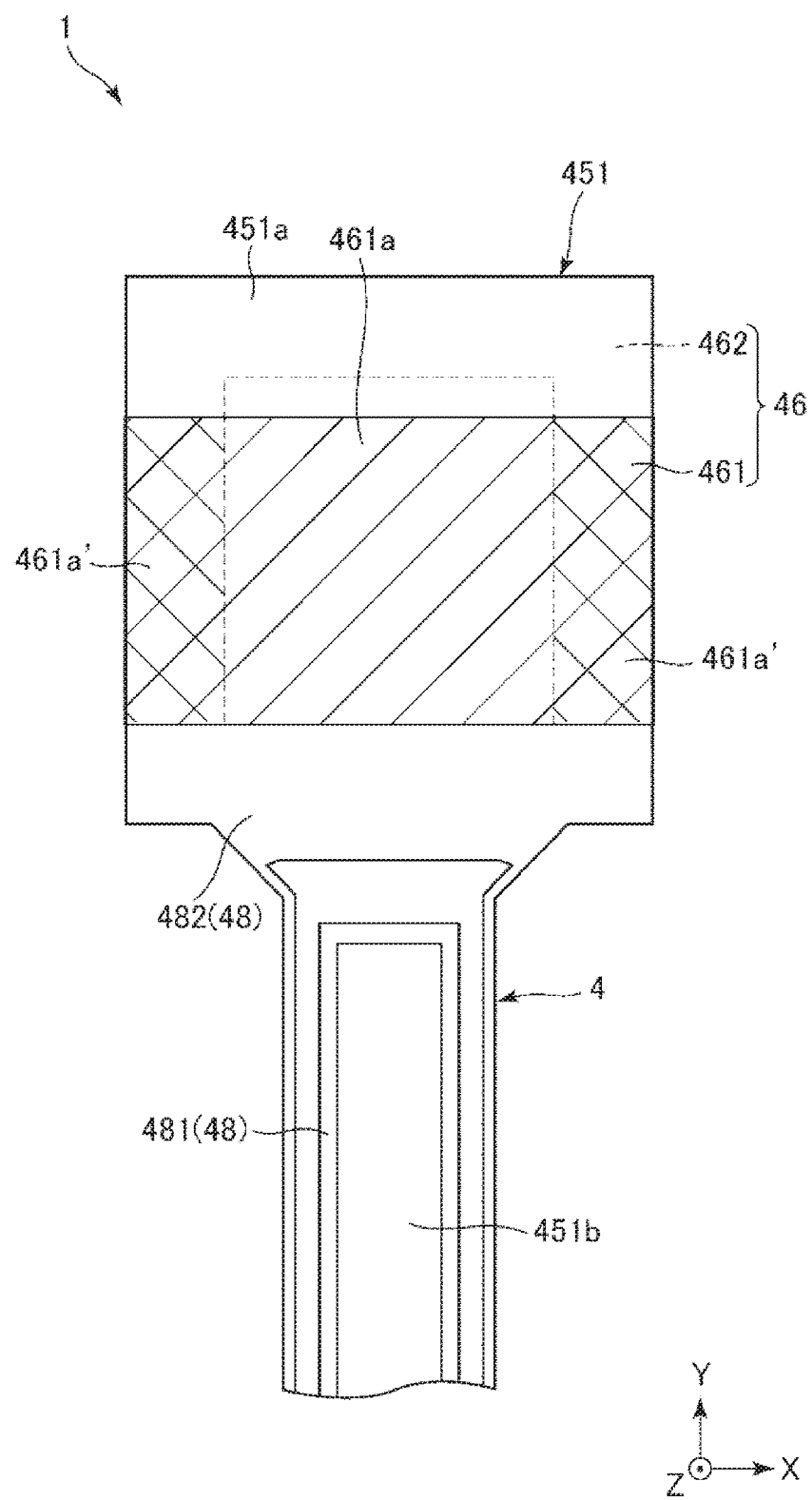
FIG. 16 is a partial enlarged plan view of a vibrator element belonging to a vibrator according to a second embodiment of the invention.

FIG. 16 is a partial enlarged plan view of a vibrator element belonging to the vibrator according to the second embodiment of the invention.

The vibrator 1 according to the present embodiment is mainly the same as the vibrator 1 according to the above-described first embodiment except that the vibrator 1 has a different configuration of the weight 46 belonging to the vibrator element 4.

In the following description, with regard to the vibrator 1 according to the second embodiment, points different from those according to the above-described embodiment will be mainly described, and the same items will be omitted in the description. In FIG. 16, the same reference numerals will be given to configurations the same as those according to the above-described embodiment.

As illustrated in FIG. 16, in the vibrator element 4 according to the present embodiment, the first weight 461 has the non-overlapping region 461*a* which does not overlap the second weight 462 in a plan view in the direction of the Z-axis, and an overlapping region 461*a*' which overlaps the second weight 462. In FIG. 16, for convenience of description, only the drive arm 451 is illustrated. However, the other drive arms 452, 453, and 454 have the same configuration.

In this manner, for example, in the first frequency adjustment step, the overlapping region 461*a*' is irradiated with the laser light LL so as to partially remove the second weight 462 together with the first weight 461. In this manner, the mass of the drive arm 451 can be reduced much more by performing the irradiation with the laser light LL at one time. Therefore, the frequency fd can be efficiently adjusted. For example, the overlapping region 461*a*' is irradiated with the laser light LL so that the frequency fd can be roughly adjusted. The non-overlapping region 461*a* is irradiated with the laser light LL so that the frequency fd can be finely adjusted.

In the second frequency adjustment step, the non-overlapping region 461*a* of the first weight 461 may be irradiated with the laser light LL as in the above-described first embodiment.

According to the second embodiment adopted in this way, it is also possible to achieve advantageous effects the same as those according to the above-described first embodiment.

Third Embodiment

Next, a vibrator according to a third embodiment of the invention will be described.

Figure 17:
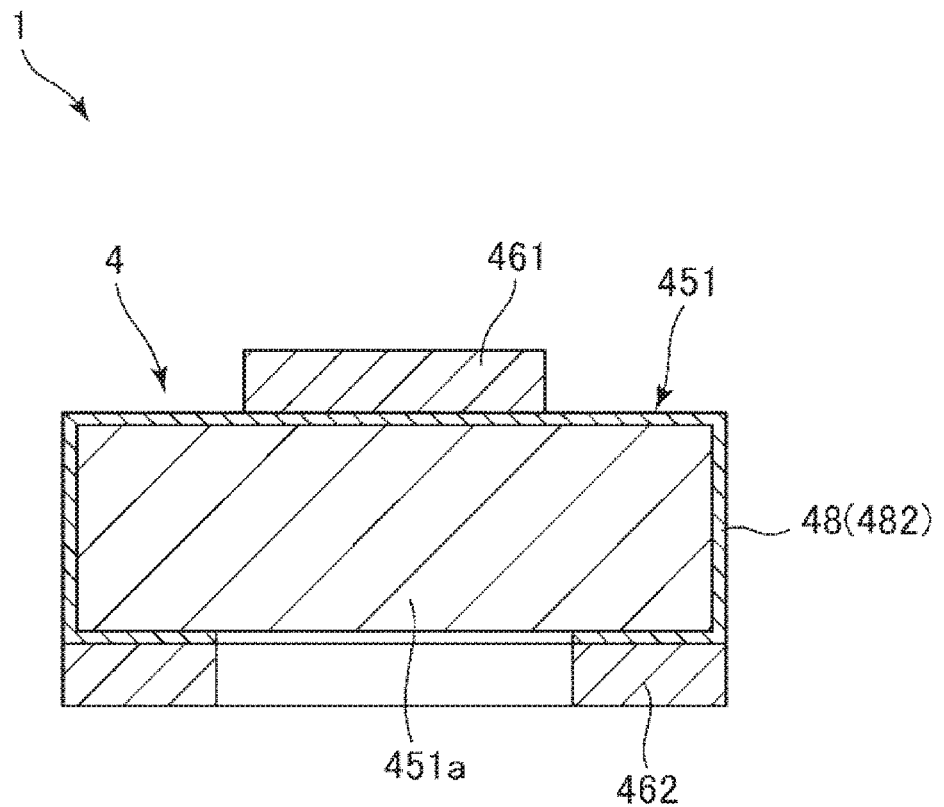
FIG. 17 is a partial enlarged sectional view of a vibrator element belonging to a vibrator according to a third embodiment of the invention.

FIG. 17 is a partial enlarged sectional view of a vibrator element belonging to the vibrator according to the third embodiment of the invention.

The vibrator 1 according to the present embodiment is mainly the same as the vibrator 1 according to the above-described first embodiment except that the electrode 48 belonging to the vibrator element 4 has a different configuration.

In the following description, with regard to the vibrator 1 according to the third embodiment, points different from those according to the above-described embodiments will be mainly described, and the same items will be omitted in the description. In FIG. 17, the same reference numerals will be given to configurations the same as those according to the above-described embodiments.

As illustrated in FIG. 17, in the vibrator element 4 according to the present embodiment, the electrode 48 (drive ground electrode 482. However, the drive signal electrode 481 in the drive arms 453 and 454) is not placed in a region which overlaps the first weight 461 in a plan view in the direction of the Z-axis, which is the lower surface of the wide portion 451*a*. In FIG. 17, for convenience of description, only the drive arm 451 is illustrated. However, the other drive arms 452, 453, and 454 have the same configuration.

In this manner, in the second frequency adjustment step, the electrode 48 placed on the lower surface of the wide portions 451*a*, 452*a*, 453*a*, and 454*a* is irradiated with the laser light LL. Accordingly, it is possible to suppress a possibility that the electrode 48 may be evaporated. Therefore, compared to the above-described first embodiment, the splash is much less likely to remain inside the package 3.

According to the third embodiment adopted in this way, it is also possible to achieve advantageous effects the same as those according to the above-described first embodiment.

Fourth Embodiment

Next, a vibrator according to a fourth embodiment of the invention will be described.

Figure 18:
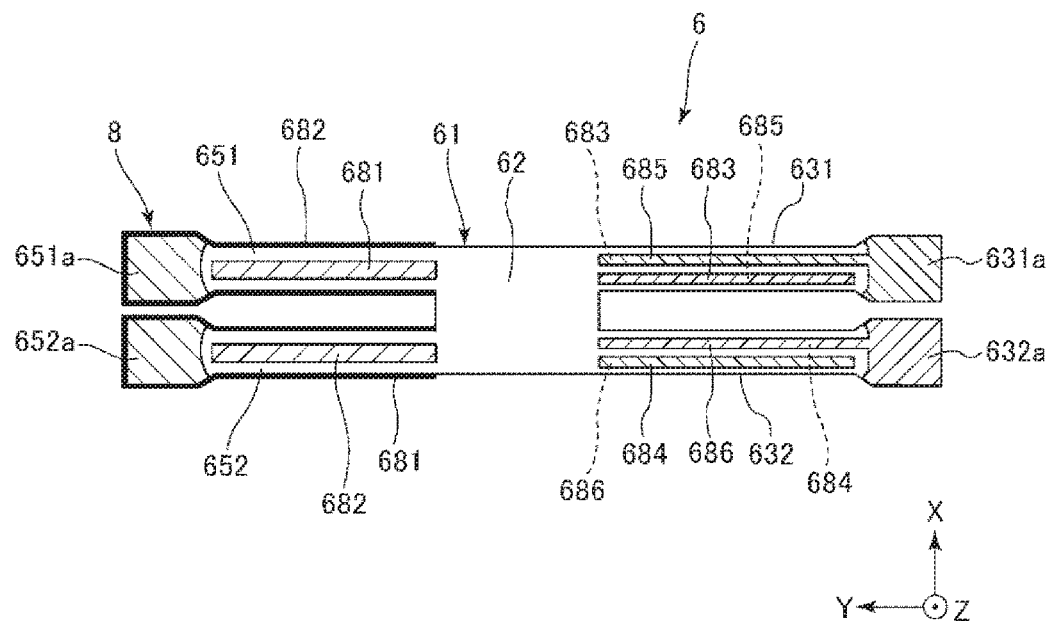
FIG. 18 is a plan view of a vibrator element belonging to a vibrator according to a fourth embodiment of the invention.
Figure 19:
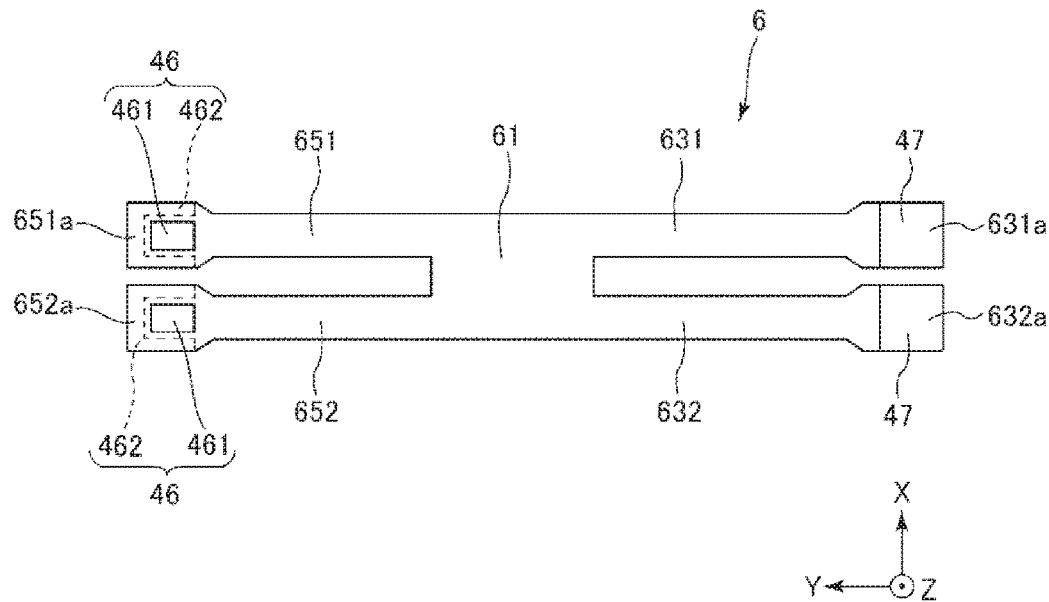
FIG. 19 is a plan view illustrating a weight belonging to the vibrator element illustrated in FIG. 18.

FIG. 18 is a plan view of a vibrator element belonging to the vibrator according to the fourth embodiment of the invention. FIG. 19 is a plan view illustrating a weight belonging to the vibrator element illustrated in FIG. 18.

The vibrator 1 according to the present embodiment is mainly the same as the vibrator 1 according to the above-described first embodiment except that the vibrator element 6 has a different configuration.

In the following description, with regard to the vibrator 1 according to the fourth embodiment, points different from those according to the above-described embodiments will be mainly described, and the same items will be omitted in the description. In FIGS. 18 and 19, the same reference numerals will be given to configurations the same as those according to the above-described embodiments.

The vibrator element 6 is an angular velocity sensor element which can detect angular velocity $\omega y$ around the Y-axis. As illustrated in FIG. 18, the vibrator element 6 has a vibrator body 61 and an electrode 68 placed in the vibrator body 61.

The vibrator body 61 is formed using a Z cut quartz crystal plate. The vibrator body 61 has a spread in an XY plane defined by the X-axis (electrical axis) and the Y-axis (mechanical axis) which are quartz crystal axes, and has a thickness in the direction of the Z-axis (optical axis). The vibrator body 61 has a base portion 62, detection arms 631 and 632 extending from the base portion 62 toward the negative side in the direction of the Y-axis, and drive arms 651 and 652 extending from the base portion 62 toward the positive side in the direction of the Y-axis. The drive arms 651 and 652 are vibrating arms for driving and vibrating the vibrator element 6. The detection arms 631 and 632 are vibrating arms which are vibrated by the Coriolis force generated by the applied angular velocity $\omega y$ so as to acquire a signal based on the Coriolis force.

The electrode 68 has a drive signal electrode 681, a drive ground electrode 682, a first detection signal electrode 683, a second detection signal electrode 684, a first detection ground electrode 685, and a second detection ground electrode 686.

The drive signal electrode 681 is placed on the upper and lower surfaces of the drive arm 651 and on both side surfaces of the drive arm 652. The drive ground electrode 682 is placed on both side surfaces of the drive arm 651 and on the upper and lower surfaces of the drive arm 652. On the other hand, the first detection signal electrode 683 is placed on the negative side in the direction of the X-axis of the upper surface of the detection arm 631 and on the positive side in the direction of the X-axis of the lower surface. The first detection ground electrode 685 is placed on the positive side in the direction of the X-axis of the upper surface of the detection arm 631 and on the negative side in the direction of the X-axis of the lower surface. The second detection signal electrode 684 is placed on the negative side in the direction of the X-axis of the upper surface of the detection arm 632 and on the positive side in the direction of the X-axis of the lower surface. The second detection ground electrode 686 is placed on the positive side in the direction of the X-axis of the upper surface of the detection arm 632 and on the negative side in the direction of the X-axis of the lower surface.

The vibrator element 6 configured in this way detects the angular velocity $\omega y$ as follows. If a drive signal (drive voltage) is applied between the drive signal electrode 681 and the drive ground electrode 682, the drive arms 651 and 652 perform flexural vibration in reversed phases in the direction of the X-axis. In this state, the vibrations of the drive arms 651 and 652 are cancelled by each other. Accordingly, the detection arms 631 and 632 are not substantially vibrated. In this state, if the angular velocity $\omega y$ around the Y-axis is applied, the Coriolis force acts on the drive arms 651 and 652, and the flexural vibration in the direction of the Z-axis is excited. In response to this flexural vibration, the detection arms 631 and 632 perform flexural vibration in the direction of the Z-axis. An electric charge generated in the detection arm 631 by the flexural vibration is taken out as a first detection signal from the first detection signal electrode 683, and an electric charge generated in the detection arm 632 is taken out as a second detection signal from the second detection signal electrode 684. Accordingly, the angular velocity $\omega y$ can be detected, based on the first and second detection signals.

As illustrated in FIG. 19, the vibrator element 6 has the weights 46 and 47 placed in the vibrator body 61. The weight 46 is disposed in the wide portions 651a and 652a of the respective drive arms 651 and 652, and the weight 47 is disposed in the wide portions 631a and 632a of the respective detection arms 631 and 632.

According to the fourth embodiment adopted in this way, it is also possible to achieve advantageous effects the same as those according to the above-described first embodiment.

Fifth Embodiment

Next, an electronic device according to a fifth embodiment of the invention will be described.

Figure 20:
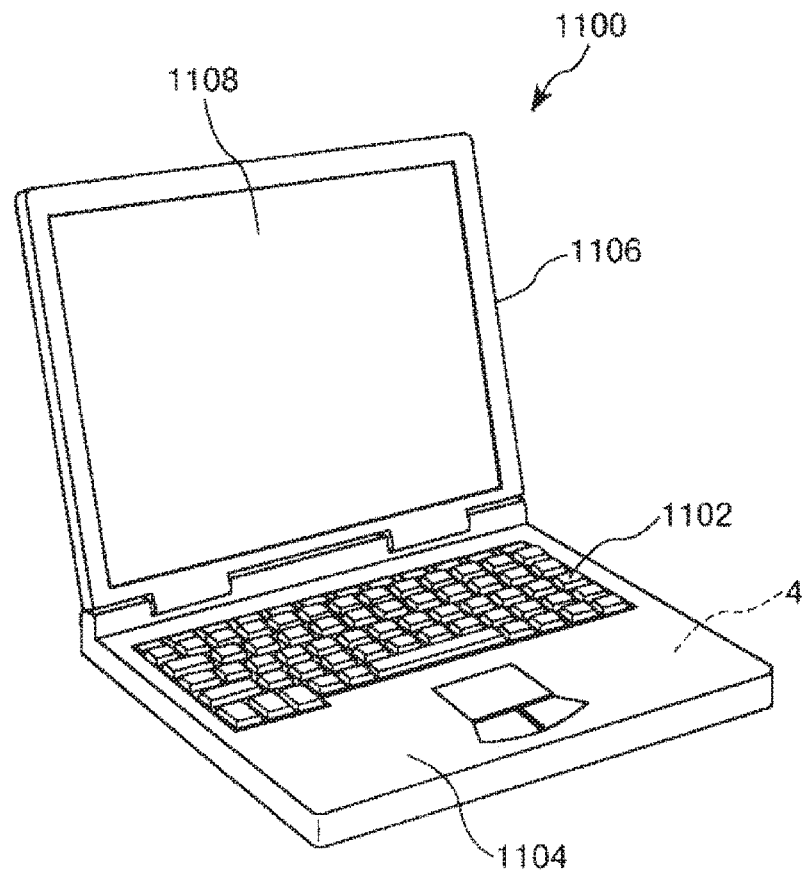
FIG. 20 is a perspective view illustrating an electronic device according to a fifth embodiment of the invention.

FIG. 20 is a perspective view illustrating the electronic device according to the fifth embodiment of the invention.

A mobile (or notebook) personal computer 1100 illustrated in FIG. 20 is an example to which the electronic device including the vibrator element according to the invention is applied. In this drawing, a personal computer 1100 is configured to include a main body 1104 provided with a keyboard 1102, and a display unit 1106 provided with a display portion 1108. The display unit 1106 is supported so as to be pivotable with respect to the main body 1104 via a hinge structure portion. This personal computer 1100 is internally equipped with the vibrator element 4 functioning as the angular velocity sensor. Here, for example, as the vibrator element 4, any one of the above-described embodiments can be adopted.

This personal computer 1100 (electronic device) has the vibrator element 4. Therefore, it is possible to achieve the advantageous effect of the vibrator element 4 described above, and it is possible to achieve high reliability. For example, the vibrator element 4 may be incorporated in the personal computer 1100, as the vibrator 1 according to the above-described embodiments.

Sixth Embodiment

Next, an electronic device according to a sixth embodiment of the invention will be described.

Figure 21:
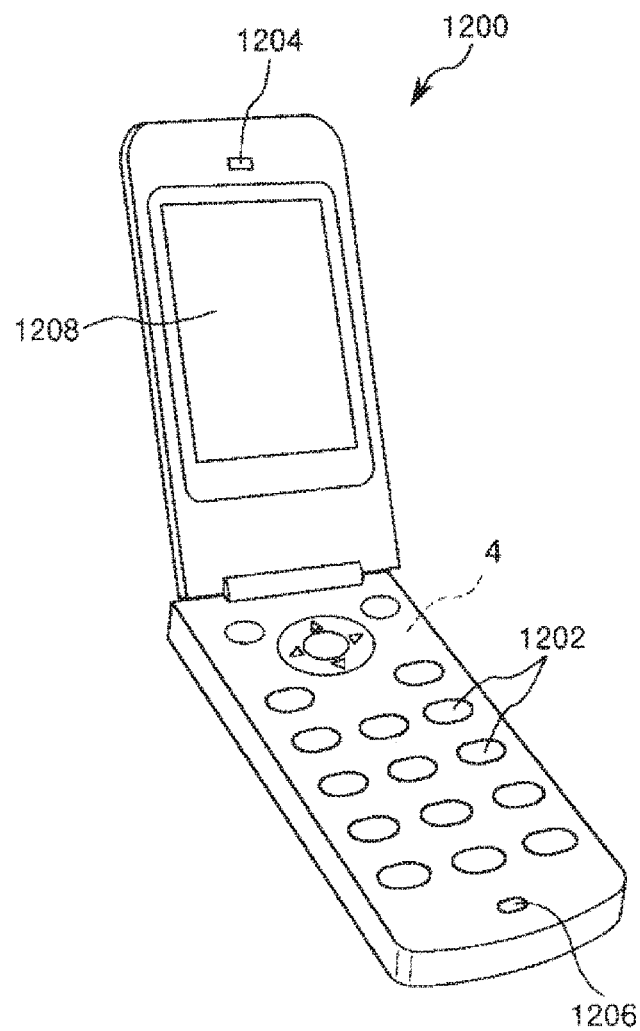
FIG. 21 is a perspective view illustrating an electronic device according to a sixth embodiment of the invention.

FIG. 21 is a perspective view illustrating the electronic device according to the sixth embodiment of the invention.

A mobile phone 1200 (including PHS) illustrated in FIG. 21 is an example to which the electronic device including the vibrator element according to the invention is applied. In this drawing, the mobile phone 1200 includes an antenna (not illustrated), a plurality of operation buttons 1202, an earpiece 1204, and a mouthpiece 1206. A display portion 1208 is disposed between the operation buttons 1202 and the earpiece 1204. This mobile phone 1200 is internally equipped with the vibrator element 4 functioning as the angular velocity sensor. Here, for example, as the vibrator element 4, any one of the above-described embodiments can be adopted.

This mobile phone 1200 (electronic device) has the vibrator element 4. Therefore, it is possible to achieve the advantageous effect of the vibrator element 4 described above, and it is possible to achieve high reliability. For example, the vibrator element 4 may be incorporated in the mobile phone 1200, as the vibrator 1 according to the above-described embodiments.

Seventh Embodiment

Next, an electronic device according to a seventh embodiment of the invention will be described.

Figure 22:
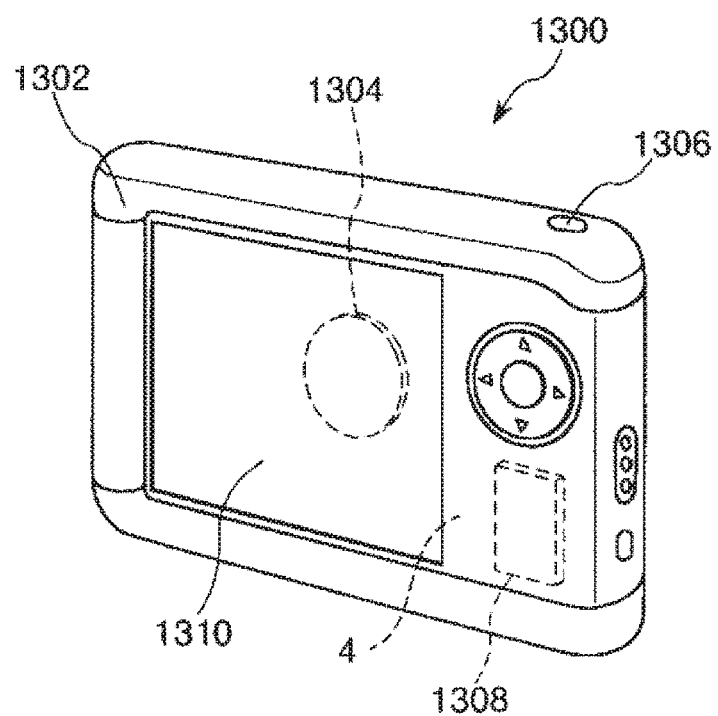
FIG. 22 is a perspective view illustrating an electronic device according to a seventh embodiment of the invention.

FIG. 22 is a perspective view illustrating the electronic device according to the seventh embodiment of the invention.

A digital still camera 1300 illustrated in FIG. 22 is an example to which the electronic device including the vibrator element according to the invention is applied. In this drawing, a display portion 1310 is disposed on a rear surface of a case (body) 1302, and is configured to perform display, based on an imaging signal transmitted by a CCD. The display portion 1310 functions as a viewfinder which displays a subject as an electronic image.

A light receiving unit 1304 including an optical lens (imaging optical system) and the CCD is disposed on a front surface side (rear surface side in the drawing) of the case 1302. If an image capturing person confirms a subject image displayed on the display portion 1310 and presses a shutter button 1306, the imaging signal of the CCD at that time is transmitted and stored in a memory 1308. This digital still camera 1300 is internally equipped with the vibrator element 4 functioning as the angular velocity sensor. Here, for example, as the vibrator element 4, any one of the above-described embodiments can be adopted.

This digital still camera 1300 (electronic device) has the vibrator element 4. Therefore, it is possible to achieve the advantageous effect of the vibrator element 4 described above, and it is possible to achieve high reliability. For example, the vibrator element 4 may be incorporated in the digital still camera 1300, as the vibrator 1 according to the above-described embodiments.

In addition to the personal computer and the mobile phone according to the above-described embodiments, and the digital still camera according to the present embodiment, for example, the electronic device according to the invention is applicable to a smartphone, a tablet terminal, a timepiece (including a smart watch), an ink jet-type discharge device (for example, an ink jet printer), a laptop-type personal computer, a television, a wearable terminal such as a head mounted display (HMD), a video camera, a video tape recorder, a car navigation device, a pager, an electronic diary (including those which are provided with a communication function), an electronic dictionary, a calculator, an electronic game machine, a word processor, a workstation, a video phone, a video monitor for security, an electronic binocular, a POS terminal, a medical instrument (for example, an electronic clinical thermometer, a blood pressure monitor, a blood glucose meter, an electrocardiogram measuring device, an ultrasound diagnosis apparatus, Electronic endoscope), a fish finder, various measuring instruments, devices for mobile terminals and base stations, meters (for example, instruments for vehicles, aircrafts, and ships), flight simulators, and network servers.

Eighth Embodiment

Next, a vehicle according to an eighth embodiment of the invention will be described.

Figure 23:
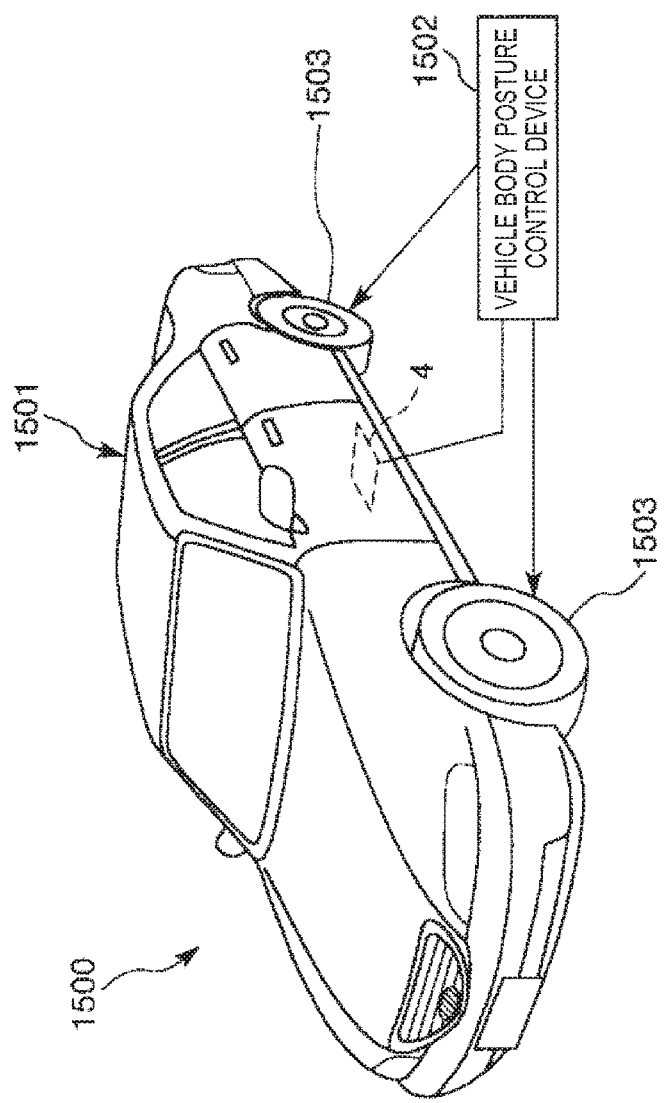
FIG. 23 is a perspective view illustrating a vehicle according to an eighth embodiment of the invention.

FIG. 23 is a perspective view illustrating the vehicle according to the eighth embodiment of the invention.

A vehicle 1500 illustrated in FIG. 23 is an example to which the vehicle including the vibrator element according to the invention is applied. In this drawing, the vehicle 1500 is internally equipped with the vibrator element 4 functioning as the angular velocity sensor. The vibrator element 4 can detect a posture of a vehicle body 1501. A detection signal of the vibrator element 4 is supplied to a vehicle body posture control device 1502. The vehicle body posture control device 1502 detects the posture of the vehicle body 1501, based on the signal. In accordance with a detection result, the vehicle body posture control device 1502 can control hardness/softness of a suspension, or can control a brake of each vehicle wheel 1503. Here, for example, as the vibrator element 4, any one of the above-described embodiments can be adopted.

This vehicle 1500 (vehicle) has the vibrator element 4. Therefore, it is possible to achieve the advantageous effect of the vibrator element 4 described above, and it is possible to achieve high reliability. For example, the vibrator element 4 may be incorporated in the vehicle 1500, as the vibrator 1 according to the above-described embodiments.

Alternatively, the vibrator element 4 is widely applicable to a car navigation system, a car air conditioner, an anti-lock braking system (ABS), an air bag, a tire pressure monitoring system (TPMS), an engine control, a hybrid vehicle, and an electronic control unit (ECU) such as a battery monitor for electric vehicles.

The vehicle is not limited to the vehicle 1500. For example, the vehicle is applicable to unmanned aircrafts such as an airplane, a rocket, an artificial satellite, a ship, an automated guided vehicle (AGV), a bipedal walking robot, and a drone.

Hitherto, the frequency adjustment method of the vibrator element, the vibrator element, the vibrator, the electronic device, and the vehicle according to the invention have been described with reference to the illustrated embodiments. However, the invention is not limited thereto. A configuration of each unit can be replaced with any desired configuration having the same function. Any other desired configuration element may be added to the invention. The invention may be realized in combination of any desired two or more configurations (characteristics) in the above-described embodiments.

A configuration of the weight 46 is not particularly limited. For example, configurations as illustrated in FIGS. 24 to 27 may be adopted in addition to the configurations according to the first embodiment and the third embodiment which are described above. For convenience of description, FIGS. 24 to 27 illustrate the drive arm 451. The other drive arms 452, 453, and 454 have the same configuration.

Figure 24:
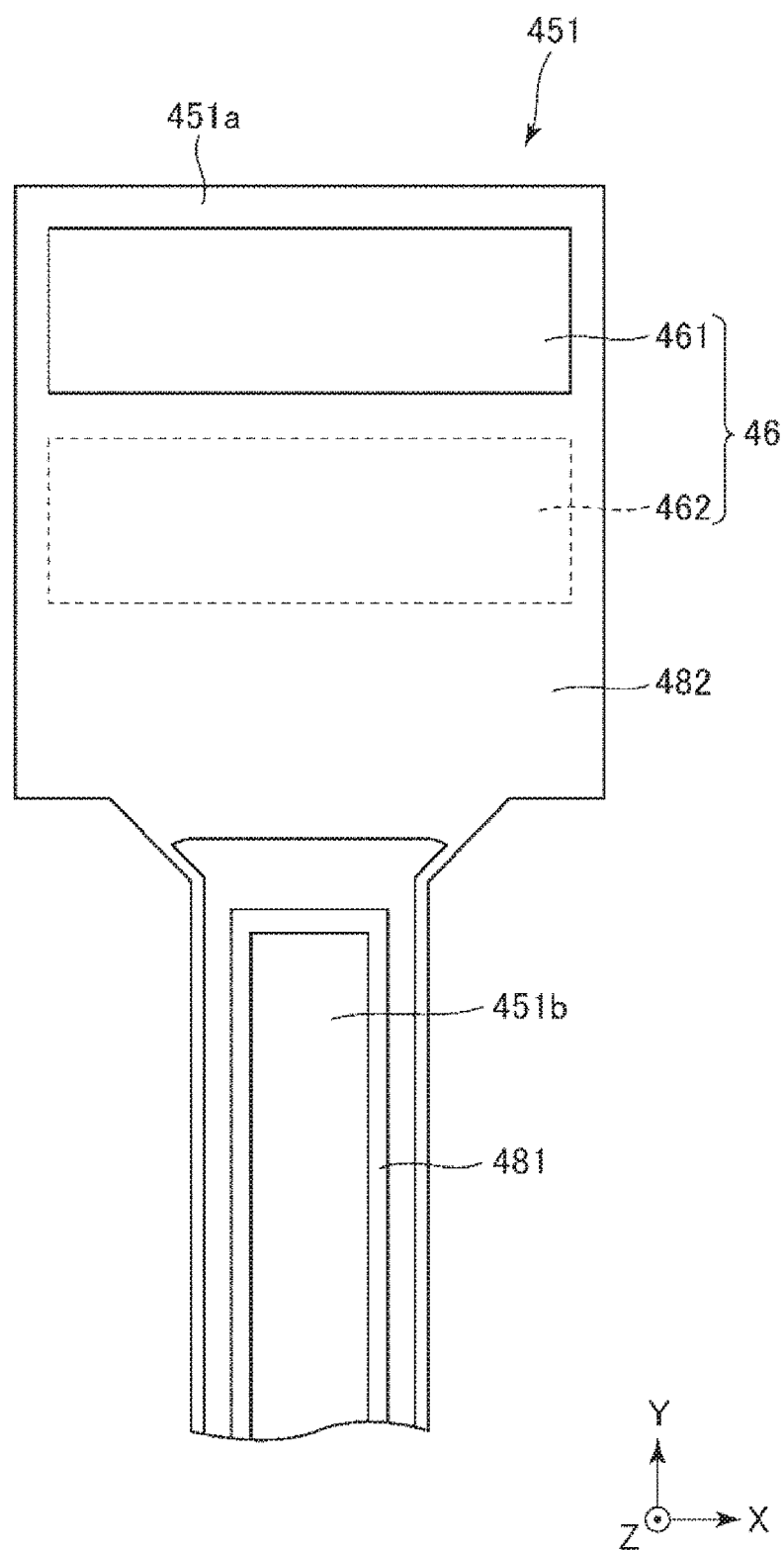
FIG. 24 is a partial enlarged plan view illustrating a modification example of a weight.

In the weight 46 illustrated in FIG. 24, the first weight 461 is disposed on the distal end side of the wide portion 451a, and the second weight 462 is disposed on the proximal end side of the wide portion 451a from the first weight 461. The first weight 461 and the second weight 462 are respectively placed by avoiding an outer edge of the wide portion 451a. In this way, the first and second weights 461 and 462 are placed by avoiding the outer edge of the wide portion 451a. Accordingly, even if the position of the first and second weights 461 and 462 deviates in an inward direction on the XY-plane due to mask displacement during the manufacturing, it is possible to suppress a possibility that a shape (size) of the first and second weights 461 and 462 may deviate. Therefore, the first and second weights 461 and 462 having the desired mass are easily placed.

Figure 25:
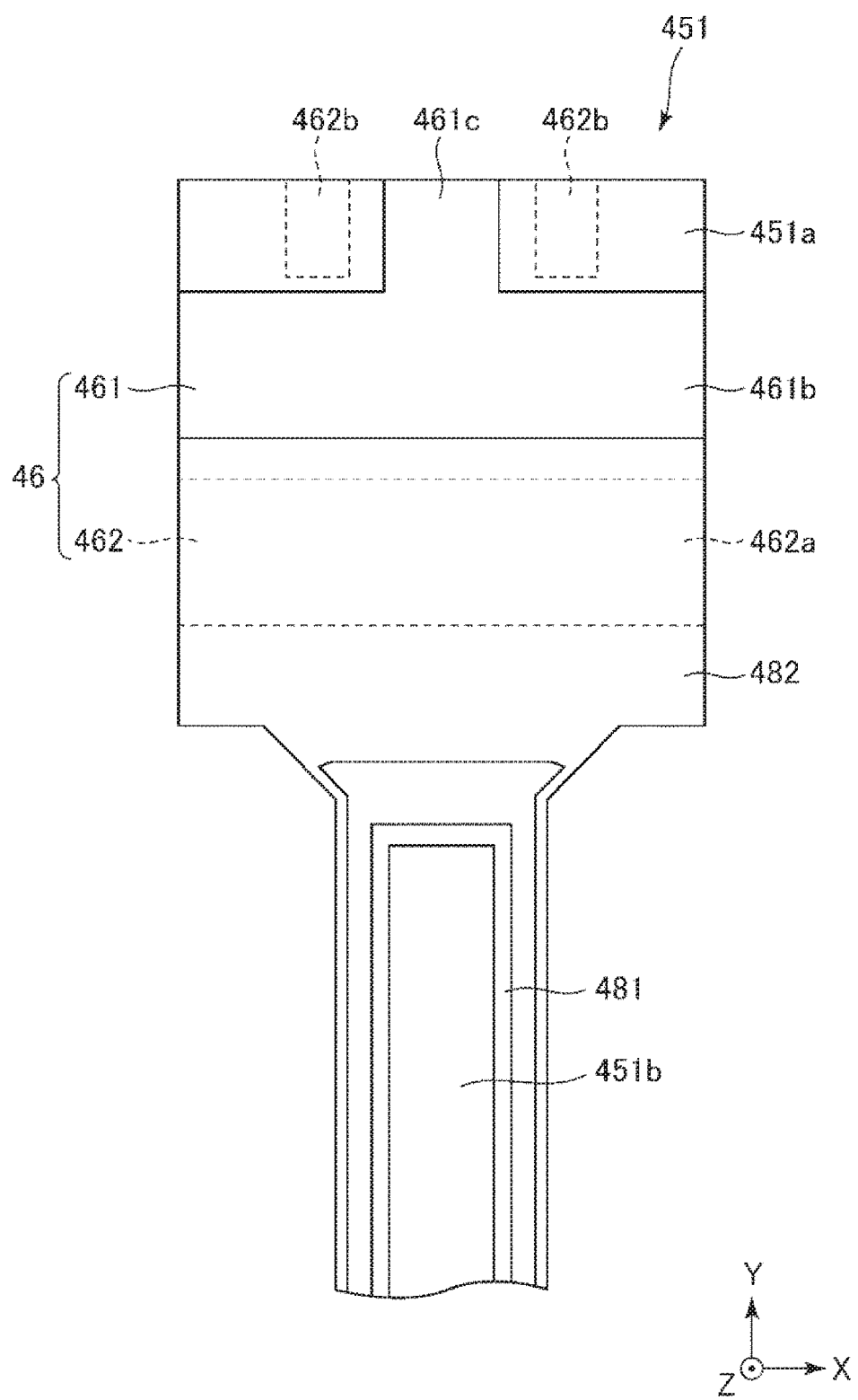
FIG. 25 is a partial enlarged plan view illustrating a modification example of the weight.

In the weight 46 illustrated in FIG. 25, the first weight 461 has a projection shape projecting to the distal end side of the wide portion 451a. Specifically, the first weight 461 has a base portion 461b and a protruding portion 461c whose width (length in the direction of the X-axis) is narrower than that of the base portion 461b and which protrudes to the distal end side from the base portion 461b. On the other hand, the second weight 462 has a first portion 462a located on the proximal end side of the wide portion 451a from the base portion 461b, and a pair of second portions 462b located on both sides in the direction of the X-axis of the protruding portion 461c. In the weight 46 having this configuration, the mass (total mass of the protruding portion 461c and the pair of second portions 462b) on the distal end side of the wide portion 451a is smaller than the mass (total mass of the base portion 461b and the first portion 462a) on the proximal end side. The frequency change with respect to the mass further increases toward the distal end side of the drive arm 451. Accordingly, if the mass on the distal end side of the drive arm 451 is decreased as in the configuration illustrated FIG. 25, the weight 46 deviates in the direction of the Y-axis. In this manner, the effect of the frequency change fluctuates. Therefore, it is possible to minimize the influence of the frequency change amount. If the weight 46 deviates to the positive side in the direction of the Y-axis in the drive arm 451, the weight 46 is also deviated to the positive side in the direction of the Y-axis in the drive arm 452. Therefore, an imbalance of the masses is caused between the drive arms 451 and 452, and the vibration (unnecessary vibration) is generated in the direction of the Y-axis in the drive vibration mode. However, according to the configuration illustrated in FIG. 25, it is possible to minimize the imbalance of the masses between the drive arms 451 and 452. Therefore, it is possible to effectively suppress the vibration (unnecessary vibration) in the direction of the Y-axis in the drive vibration mode.

Figure 26:
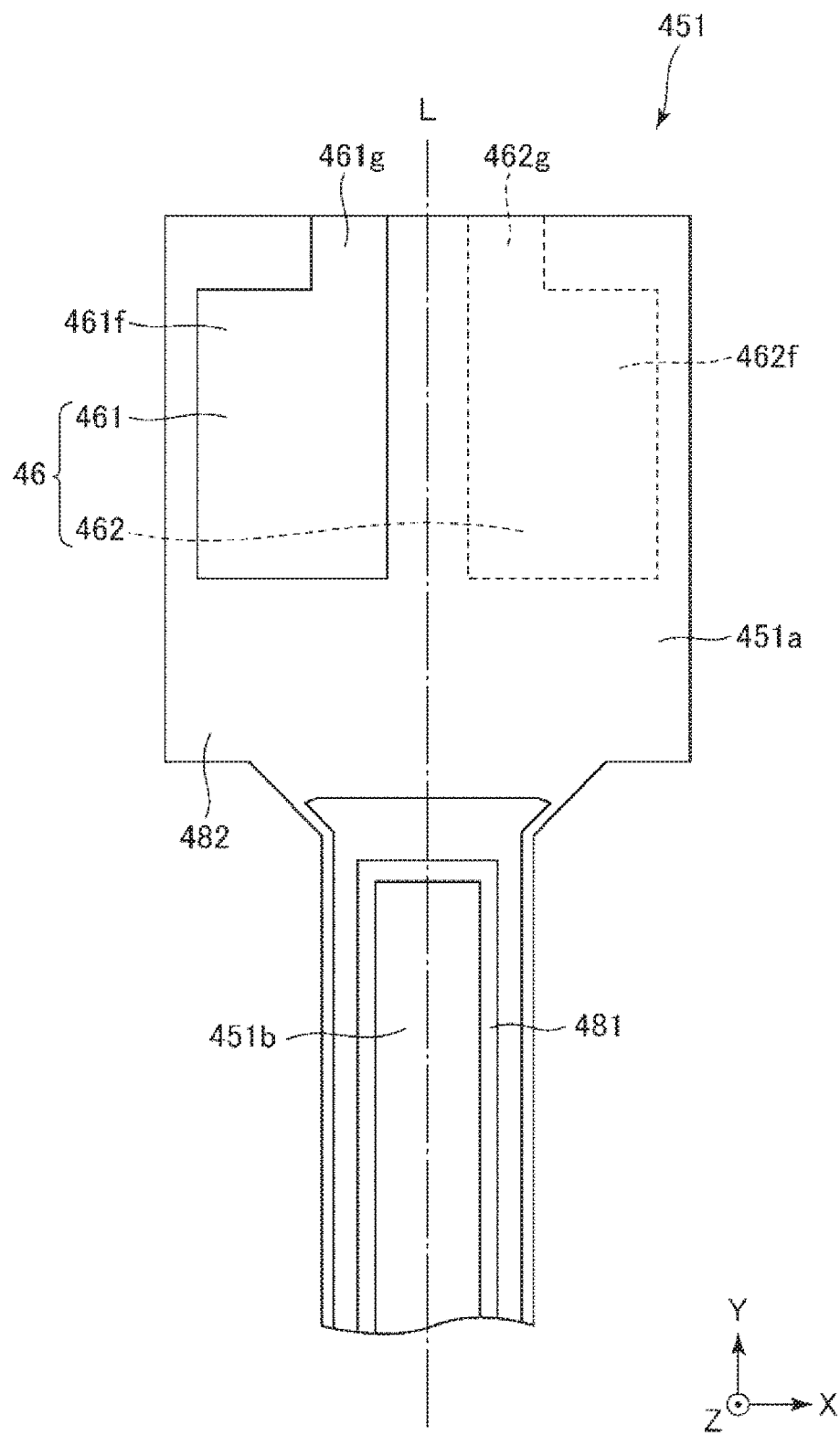
FIG. 26 is a partial enlarged plan view illustrating a modification example of the weight.

In the weight 46 illustrated in FIG. 26, the first weight 461 has a projection shape projecting to the distal end side of the wide portion 451a. Specifically, the first weight 461 has a base portion 461f and a protruding portion 461g whose width (length in the direction of the X-axis) is narrower than that of the base portion 461f and which protrudes from the base portion 461f to the distal end side. Similarly, the second weight 462 has a projection shape projecting to the distal end side of the wide portion 451a. Specifically, the second weight 462 has a base portion 462f and a protruding portion 462g whose width (length in the direction of the X-axis) is narrower than that of the base portion 462f and which protrudes from the base portion 462f to the distal end side. The first weight 461 is located on the negative side in the direction of the X-axis of the center line L, and the second weight 462 is located on the positive side in the direction of the X-axis of the center line L. Furthermore, the first and second weights 461 and 462 are placed symmetrically with respect to the center line L. According to this configuration, for example, it is possible to achieve advantageous effects the same as those of the configuration illustrated in FIG. 25.

Figure 27:
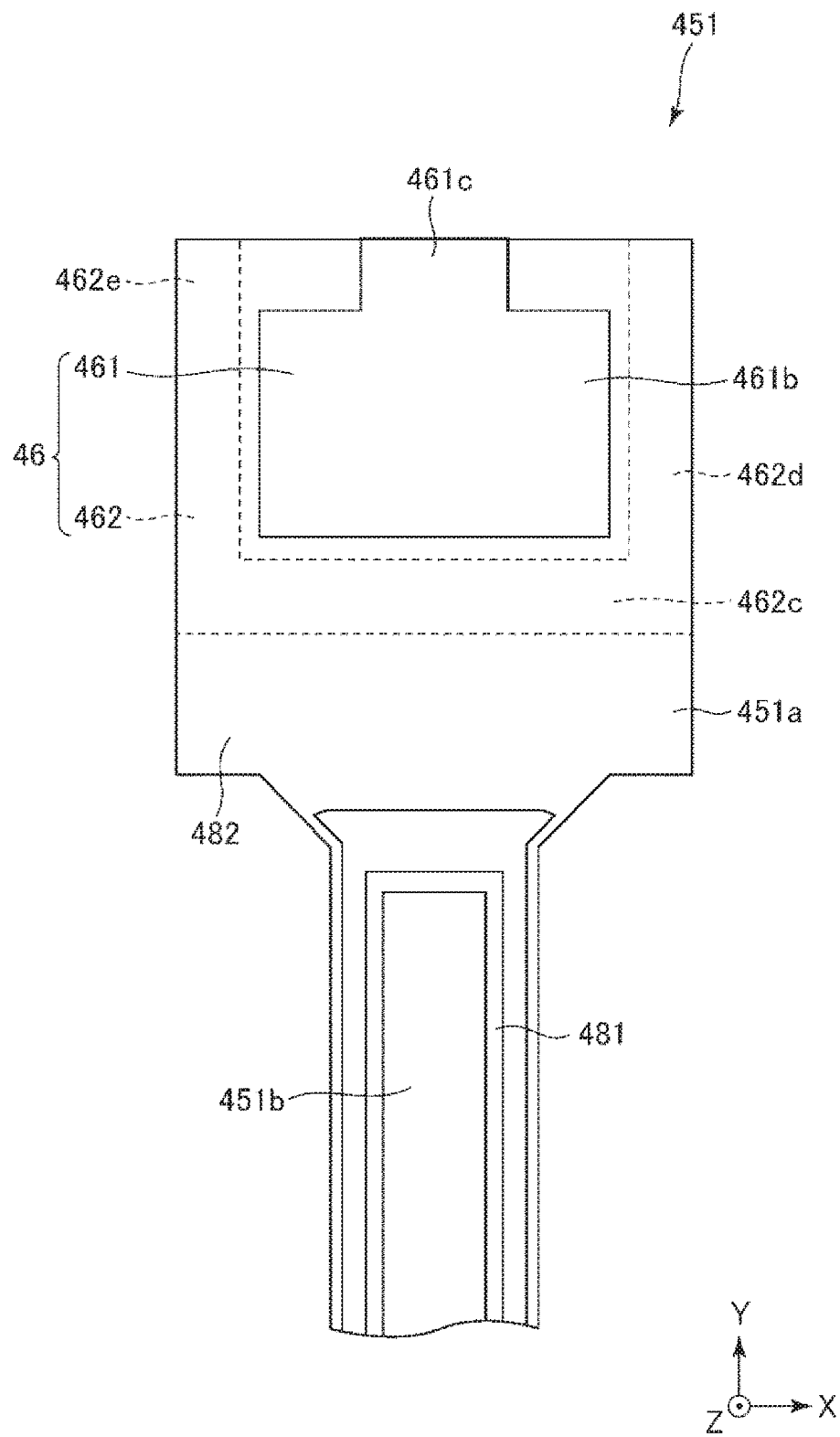
FIG. 27 is a partial enlarged plan view illustrating a modification example of the weight.

In the weight 46 illustrated in FIG. 27, the first weight 461 has a projection shape projecting to the distal end side of the wide portion 451a. Specifically, the first weight 461 has a base portion 461b and a protruding portion 461c whose width (length in the direction of the X-axis) is narrower than that of the base portion 461b and which protrudes from the base portion 461b to the distal end side. On the other hand, the second weight 462 is placed so as to surround the first weight 461 in a plan view. Specifically, the second weight 462 is located on the proximal end side from the first weight 461, and has a base portion 462c extending in the direction of the X-axis, a first extension portion 462d extending from one end portion of the base portion 462c to the distal end side along an outer edge of the wide portion 451a, and a second extension portion 462e extending from the other end portion of the base portion 462c to the distal end side along the outer edge of the wide portion 451a. The first weight 461 is pinched between the first extension portion 462d and the second extension portion 462e. According to this configuration, for example, it is possible to achieve advantageous effects the same as those of the configuration illustrated in FIG. 25.

The entire disclosure of Japanese Patent Application No. 2017-129451, filed Jun. 30, 2017 is expressly incorporated by reference herein.

What is claimed is:

1. A frequency adjustment method of a vibrator element, the method comprising:
   preparing the vibrator element, the vibrator element having:
      a vibrating arm, the vibrating arm having a first surface and a second surface outwardly opposite to each other along a first direction, a thickness along the first direction of the vibrating arm being defined as T;
      a first weight placed on the first surface of the vibrating arm; and
      a second weight placed on the second surface of the vibrating arm, wherein the first weight has a non-overlapping region which does not overlap the second weight when viewed along the first direction;
   preparing a substrate, the substrate including a wiring portion;
   fixing the vibrator element to the substrate by causing the second surface of the vibrator element to face the substrate; and
   irradiating the non-overlapping region of the first weight with an energy ray to remove a portion of the non-overlapping region of the first weight so as to adjust a resonance frequency of the vibrating arm,
   wherein a separation distance in the first direction of the vibrating arm between a centroid of a weight including the first weight and the second weight and a centroid of the vibrating arm in a cross-sectional view of the vibrating arm is defined as D, and
   after the portion of the non-overlapping region of the first weight is removed, $0<D\leq 0.2T$.

2. The frequency adjustment method of a vibrator element according to claim 1,
   wherein the first weight is placed at an area including a center in a width direction of the vibrating arm when viewed along the first direction, and the width direction is perpendicular to the first direction.

3. The frequency adjustment method of a vibrator element according to claim 1,
   wherein the second weight is placed at an area including both side portions across a center in a width direction of the vibrating arm when viewed along the first direction, and the width direction is perpendicular to the first direction.

4. The frequency adjustment method of a vibrator element according to claim 1, wherein a mass of the first weight is greater than a mass of the second weight.

* * * * *